(12) United States Patent
Naito

(10) Patent No.: US 9,644,596 B2
(45) Date of Patent: May 9, 2017

(54) IGNITER, IGNITER CONTROL METHOD, AND INTERNAL COMBUSTION ENGINE IGNITION APPARATUS

(71) Applicant: FUJI ELECTRIC CO., LTD., Kawasaki (JP)

(72) Inventor: Tatsuya Naito, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 37 days.

(21) Appl. No.: 14/555,057

(22) Filed: Nov. 26, 2014

(65) Prior Publication Data

US 2015/0084533 A1 Mar. 26, 2015

Related U.S. Application Data

(63) Continuation of application No. PCT/JP2013/073431, filed on Aug. 30, 2013.

(30) Foreign Application Priority Data

Aug. 30, 2012 (JP) .................. 2012-190385
Aug. 9, 2013 (JP) .................. 2013-166406

(51) Int. Cl.
*F02P 3/055* (2006.01)
*H01L 29/739* (2006.01)
(Continued)

(52) U.S. Cl.
CPC ............. *F02P 3/0552* (2013.01); *F02P 3/05* (2013.01); *H01L 27/0203* (2013.01);
(Continued)

(58) Field of Classification Search
CPC .... F02P 3/05; F02P 3/055; F02P 3/051; F02P 3/00; H01L 27/0203; H01L 29/7395; H01L 27/0825
See application file for complete search history.

(56) References Cited

U.S. PATENT DOCUMENTS 5,557,128 A    9/1996  Yamazaki et al.
5,967,128 A    10/1999 Omuki et al.
(Continued)

FOREIGN PATENT DOCUMENTS

JP    7-245394    9/1995
JP    9-162391    6/1997
(Continued)

OTHER PUBLICATIONS

International Search Report mailed Nov. 19, 2013, in corresponding International Patent Application No. PCT/JP2013/073431.
(Continued)

*Primary Examiner* — Thai Pham

(57) ABSTRACT

An igniter is not provided with a depression IGBT and is configured such that a distance between a main IGBT and a sense IGBT is equal to or greater than 100 μm and equal to or less than 700 μm and preferably equal to or greater than 100 μm and equal to or less than 200 μm. The igniter is controlled such that, before the overcurrent of the main IGBT reaches a predetermined upper limit, a sense current of the sense IGBT is saturated. Therefore, it is possible to provide the igniter which has a small size and prevents the overshoot of a collector current of the main IGBT when a current is limited and an internal combustion engine ignition apparatus which includes the igniter, has a small size, and prevents an ignition error.

15 Claims, 17 Drawing Sheets

(51) Int. Cl.
*H01L 27/02* (2006.01)
*F02P 3/05* (2006.01)
*H01L 27/082* (2006.01)
*F02P 17/00* (2006.01)

(52) U.S. Cl.
CPC .......... *H01L 29/7395* (2013.01); *F02P 17/00* (2013.01); *H01L 27/0825* (2013.01)

(56) References Cited

U.S. PATENT DOCUMENTS

| | | | | |
|---|---|---|---|---|
| 5,970,964 | A | 10/1999 | Furuhata et al. | |
| 6,539,929 | B2* | 4/2003 | Ito | F02P 3/0554 123/630 |
| 7,051,724 | B2* | 5/2006 | Uruno | H01L 29/7395 123/644 |
| 7,341,052 | B2* | 3/2008 | Kawakita | F02P 3/0552 123/647 |
| 2004/0200463 | A1 | 10/2004 | Ando | |
| 2009/0139505 | A1* | 6/2009 | Naito | F02P 3/0552 123/644 |
| 2010/0059028 | A1 | 3/2010 | Ueno | |

FOREIGN PATENT DOCUMENTS

| | | |
|---|---|---|
| JP | 9-280147 | 10/1997 |
| JP | 10-325384 | 12/1998 |
| JP | 2000-310173 | 11/2000 |
| JP | 2004-316469 | 11/2004 |
| JP | 2008-78375 | 4/2008 |
| JP | 2009-117786 | 5/2009 |
| JP | 2010-45141 | 2/2010 |

OTHER PUBLICATIONS

Chinese Office Action dated Feb. 15, 2016 in corresponding Chinese Patent Application No. 201380028958.5.

* cited by examiner

IGNITER, IGNITER CONTROL METHOD, AND INTERNAL COMBUSTION ENGINE IGNITION APPARATUS

CROSS-REFERENCE TO RELATED APPLICATIONS

This is a continuation application, filed under 35 U.S.C. §111(a), of International Patent Application No. PCT/JP2013/073431 filed on Aug. 30, 2013, which claims the foreign benefit of Japanese Patent Application No. 2012-190385, filed on Aug. 30, 2012, and of Japanese Patent Application No. 2013-166406, filed Aug. 9, 2013, the disclosures of all of which are incorporated herein by reference.

BACKGROUND

1. Field

The present disclosure relates to an igniter, an igniter control method, and an internal combustion engine ignition apparatus including the igniter.

2. Description of Related Art

There is an increasing demand for improving the "safety", "comfort", and "environmental performance" of vehicles. With an increase in the number of electronic components used in the vehicles, the number of semiconductors used per vehicle increases and there is a demand for an in-vehicle semiconductor device with "high reliability", a "small size", and a "low cost". Similarly, a technique has been developed which reduces the size of an internal combustion engine ignition apparatus to reduce the size of an engine or improves energy efficiency to improve fuel efficiency and environment. In addition, it is necessary to increase the amount of current and voltage resistance in order to reduce the size of an igniter forming the internal combustion engine ignition apparatus or to improve the performance of the igniter.

In the related art, a current-detection-type igniter has been mainly used which detects a current on the basis of a voltage drop across a shunt resistor for current detection that is connected in series to an insulated gate bipolar transistor (IGBT; hereinafter, referred to as a main IGBT) for blocking a primary current which flows to the primary side of an ignition coil. However, the sum of a saturation voltage VCE (sat) between the collector and the emitter and a voltage which is generated by the shunt resistor for current detection increases, which results in an increase in the loss of the igniter.

In contrast, in a sense IGBT type in which a sense IGBT that is connected in parallel to the main IGBT detects and controls the current, since the shunt resistor for current detection (sense resistor) is connected in series to the sense IGBT, the shunt resistor for current detection which is connected in series to the main IGBT is not needed. As such, since the shunt resistor for current detection which is connected in series to the main IGBT is not needed, the loss of the igniter does not increase. Therefore, in recent years, the sense IGBT type has been widely used.

Next, the structure of an internal combustion engine ignition apparatus according to the related art will be described. FIG. 9 is a circuit diagram illustrating the circuit structure of a main portion of an internal combustion engine ignition apparatus 500 according to the related art. The internal combustion engine ignition apparatus 500 according to the related art illustrated in FIG. 9 includes an igniter 600, an ignition coil 202, and a spark plug 203. The igniter 600 includes an IGBT unit 51, a control IC unit 52, a battery resistor RB, and a capacitor CBG. The igniter 600 is a multi-chip igniter 601 including a semiconductor chip D1 and a semiconductor chip D2.

The IGBT unit 51 which is formed in the semiconductor chip D1 includes a main IGBT 3, a sense IGBT 4, a depression IGBT 20, a G-C zener diode 5 (G indicates a gate and C indicates a collector), a surge protective G-E zener diode 6 (E indicates an emitter), a diode 7, a resistor 8, a surge protective sense G-E zener diode 9, a surge protective resistor 10, and a surge protective zener diode 11. The sense IGBT 4 and the main IGBT 3 share a collector 3a.

The depression IGBT 20 is connected between the collector 3a and a gate 3b of the main IGBT 3. The depression IGBT 20 has a function of increasing the gate potential of the main IGBT 3 to suppress the oscillation of a collector current Ic of the main IGBT 3. The G-C zener diode 5 is connected between the gate 3b and the collector 3a of the main IGBT 3. The G-C zener diode 5 has a function of clamping a collector voltage VCE of the sense IGBT 4 and the main IGBT 3. The G-E zener diode 6 is connected between the gate 3b and an emitter 3c of the main IGBT 3.

The diode 7 is connected between the emitter 3c of the main IGBT 3 and an emitter 4c of the sense IGBT 4. The diode 7 has a function of setting the emitter voltage of the sense IGBT 4 to be higher than the emitter voltage of the main IGBT 3. The diode 7 is an asymmetric bidirectional zener diode in which different series of zener diodes are connected in inversely parallel to each other. The resistor 8 is connected between the gate 3b of the main IGBT 3 and a gate 4b of the sense IGBT 4. The resistor 8 has a function of setting the gate voltage of the sense IGBT 4 to be lower than the gate voltage of the main IGBT 3.

The sense G-E zener diode 9 is connected between the gate 4b and the emitter 4c of the sense IGBT 4. One end of the resistor 10 is connected to a connection point 8a among the gate 3b of the main IGBT 3, the G-C zener diode 5, and the resistor 8. The zener diode 11 is connected between the other end of the resistor 10 and the ground. A connection point 11a between the resistor 10 and the zener diode 11 is connected to a gate terminal GATE of the control IC unit 52. In addition, the emitter 4c of the sense IGBT 4 is connected to a sense terminal SNS of the control IC unit 52.

The control IC unit 52 which is formed in the semiconductor chip D2 includes, for example, a sense resistor Rsns, a sense terminal SNS, the gate terminal GATE, a battery terminal BM, a control terminal SIN, and a ground terminal GND. For example, a current limiting circuit and an overheat detection circuit which are not illustrated are formed in the control IC unit 52. A sense current Isns flows to the sense resistor Rsns and a sense voltage Vsns is generated.

The battery terminal BM is connected to a battery terminal B of the multi-chip igniter 601 through a battery resistor RB. A connection point between the battery resistor RB and the capacitor CBG is connected to one end of the ignition coil 202. The control terminal SIN of the control IC unit 52 is connected to a control terminal S of the multi-chip igniter 601. The ground terminal GND of the control IC unit 52 is connected to a ground terminal G of the multi-chip igniter 601.

The collector 3a of the main IGBT 3 is connected to a collector terminal CM of the IGBT unit 51. The collector terminal CM is connected to a collector terminal C of the multi-chip igniter 601. The collector terminal C of the multi-chip igniter 601 is connected to the primary end of the ignition coil 202. The secondary end of the ignition coil 202 is connected to one end of the spark plug 203. The other end of the spark plug 203 is connected to the ground.

Next, the arrangement of the main IGBT 3 and the sense IGBT 4 in the IGBT unit 51 forming the multi-chip igniter 601 (conventional product) according to the related art will be described. FIG. 10 is a plan view illustrating the planar arrangement of the main IGBT 3 and the sense IGBT 4 illustrated in FIG. 9. FIG. 10 illustrates two conventional products (hereinafter, referred to as conventional products No. 1 and No. 2). The conventional products No. 1 and No. 2 are different from each other in a distance L between the sense IGBT 4 and the main IGBT 3. In FIG. 10, the conventional products No. 1 and No. 2 are illustrated in one figure in order to clarify the difference in the distance L between the sense IGBT 4 and the main IGBT 3. However, the conventional products No. 1 and No. 2 are examples of different multi-chip igniters 601. That is, the conventional products No. 1 and No. 2 each include one sense IGBT 4 and one main IGBT 3. Of two sense IGBTs 4 illustrated in FIG. 10, the right sense IGBT is the sense IGBT 4 of the conventional product No. 1 and the left sense IGBT is the sense IGBT 4 of the conventional product No. 2.

As illustrated in FIG. 10, the main IGBT 3 has, for example, a concave polygonal shape in a plan view in which at least one interior angle (reentrant corner) is greater than 180 degrees. The sense IGBT 4 is arranged so as to face two sides that form the interior angle of the main IGBT 3. Specifically, in the product No. 1 according to embodiments of the invention described later in this disclosure, for example, the distance L between the sense IGBT 4 and one of the sides that form the interior angle of the reentrant corner of the main IGBT 3 is about 150 μm. But in both the conventional products No. 1 and No. 2, the sense IGBT 4 is arranged so as to be a predetermined distance L away from one of the sides of the main IGBT 3 that form the interior angle of the reentrant corner and so as to be close to the other side forming the interior angle of the reentrant corner. In the conventional product No. 1, the distance L between the sense IGBT 4 and the main IGBT 3 is 800 μm. In the conventional product No. 2, the distance L between the sense IGBT 4 and the main IGBT 3 is 1000 μm.

In FIG. 10, in some cases, a $p^+$ extraction region 4e which is represented by a dotted line so as to surround the sense IGBT 4 is provided in order to extract an excessively large amount of hole current which flows from the main IGBT 3 to the sense IGBT 4 and to increase a sense ratio (=the collector current Ic/the sense current Isns).

Next, the operation of the internal combustion engine ignition apparatus 500 illustrated in FIG. 9 will be described. A voltage is applied from the battery terminal B to the control IC unit 52. The voltage is a power supply voltage of the control IC unit 52. In addition, the voltage is applied from the battery terminal B to the main IGBT 3 through the ignition coil 202 and the collector terminal CM of the IGBT unit 51.

First, the normal operation of the internal combustion engine ignition apparatus 500 will be described. When an on control signal is input from an engine control unit (ECU) (not illustrated) to the control terminal S of the multi-chip igniter 601 forming the internal combustion engine ignition apparatus 500, the control signal is applied to the control terminal SIN of the control IC unit 52. When the control signal is input to the control terminal SIN, the control IC unit 52 processes the signal. Then, a gate signal is input from the gate terminal GATE of the control IC unit 52 to the gate 3b of the main IGBT 3 through the resistor 10 of the IGBT unit 51 and is also input to the gate 4b of the sense IGBT 4 through the resistor 8.

When the gate signal is input to the main IGBT 3 and the sense IGBT 4 at the same time, the main IGBT 3 and the sense IGBT 4 are turned on at the same time. Then, the collector current Ic, which is a main current, flows from the battery terminal B to the main IGBT 3 through the ignition coil 202 and the sense current Isns flows to the sense IGBT 4. Since the sense current Isns flows to the ground through the sense resistor Rsns, the sense voltage Vsns is generated at both ends of the sense resistor Rsns. The sense voltage Vsns is input to the control IC unit 52 and is processed by a logic circuit (not illustrated). An optimum gate signal is output from the gate terminal GATE.

On the other hand, when an off control signal is input to the control terminal S of the multi-chip igniter 601, the main IGBT 3 and the sense IGBT 4 are turned off at the same time. When the main IGBT 3 is turned off, the collector current Ic which flows to the main IGBT 3 through the ignition coil 202 is blocked and a high voltage is generated on the secondary side of the ignition coil 202 by induced electromotive force (=L×dIc/dt) which is generated by the inductance L of the ignition coil 202 and the rate of change of current dIc/dt. When the high voltage is applied to the spark plug 203, an electric discharge occurs in the spark plug 203 and the air-fuel mixture in a fuel chamber (not illustrated) is ignited. When energy stored in the ignition coil 202 is emitted, the flame is extinguished by the extinction operation of the spark plug 203.

Next, an abnormal operation of the internal combustion engine ignition apparatus 500 will be described with reference to FIG. 12 which will be described below. When overcurrent flows to the main IGBT 3 due to any error, the sense voltage Vsns which is generated at the sense resistor Rsns of the control IC unit 52 increases. Therefore, a current limiting circuit (not illustrated) of the control IC unit 52 processes the sense voltage Vsns to reduce a gate voltage VGE output from the gate terminal GATE, thereby suppressing the collector current Ic which flows to the main IGBT 3 to an overcurrent limiting current value Io.

In this case, when the collector current Ic is greater than the overcurrent limiting current value Io, the gate voltage VGE is reduced and the collector current Ic is rapidly reduced to the overcurrent limiting current value Io through a peak value Ip. When a difference (drop) between the peak value Ip and the overcurrent limiting current value Io is large, the overshoot of the collector current Ic increases and the collector voltage VCE oscillates greatly. The secondary voltage of the ignition coil 202 increases due to the large oscillation of the collector voltage VCE and an ignition error occurs in the spark plug 203.

In order to suppress the overshoot of the collector current Ic caused by the oscillation of the collector voltage VCE, a depression IGBT 20 is provided in the igniter 600, as illustrated in FIG. 9 (for example, see JP 9-280147 A). When the depression IGBT 20 is used as a constant current circuit, the gate voltage VGE of the main IGBT 3 increases. When the gate voltage VGE increases, the overcurrent limiting current value Io increases and the overshoot of the collector current Ic of the main IGBT 3 is reduced. Therefore, the oscillation of the collector voltage VCE is suppressed. As a result, the secondary voltage of the ignition coil 202 is suppressed and an ignition error in the spark plug 203 is prevented.

In the depression IGBT 20, the gate and the emitter are short-circuited to form a constant current circuit. In the multi-chip igniter 601 illustrated in FIG. 9, the IGBT unit 51 and the control IC unit 52 are formed in different semiconductor chips D1 and D2 and the semiconductor chips D1 and D2 are fixed to, for example, a lead frame or a ceramic substrate with a conductive pattern which is not illustrated.

Next, patent documents related to the igniter will be described. First, JP 9-280147 A discloses the following content. In an igniter having a protective circuit, when the flow of a current to an IGBT is blocked due to an error, such as overcurrent, a collector current of the IGBT flows to a sense resistor through a sense IGBT to detect a potential difference. When the detected potential difference is greater than a predetermined value, the gate voltage of the IGBT is reduced to suppress an increase in the current of the IGBT.

At that time, in a MOS gate (metal-oxide-semiconductor insulated gate) element, such as an IGBT, a saturation current is constant with respect to the collector voltage. Therefore, when the gate voltage is reduced, the current of the IGBT is rapidly reduced to a value corresponding to the reduced gate voltage. An induced electromotive force is generated in the coil by the rapid reduction in the current and the collector voltage of the IGBT increases rapidly. The current of the IGBT is reduced by the rapidly increased collector voltage. The reduction in the current of the IGBT is detected and the gate voltage increases rapidly again in order to make the current flow to the IGBT. Then, the collector voltage is rapidly reduced. This operation is repeated and the collector voltage oscillates. The voltage of the spark plug is higher than a discharge voltage according to the collector voltage during the oscillation, which causes an ignition error.

In order to solve this problem, a depression IGBT which is a constant current source is inserted between the collector and gate of the IGBT. When the gate voltage is reduced during the detection of overcurrent, the constant current source increases the gate voltage with the increase in the collector voltage, thereby compensating for the reduction in the gate voltage. That is, the rate of decrease of the gate voltage is reduced and the gate voltage is gently reduced. Therefore, the rate of decrease of the current of the IGBT is reduced and the current is gently reduced. As a result, the oscillation of the collector voltage is suppressed. It is possible to prevent an ignition error in the spark plug.

JP 2009-117786 A discloses the following content. JP 2009-117786 A discloses a one-chip igniter in which a main IGBT, a sense IGBT, a depression IGBT, and a protective circuit (corresponding to the control IC unit illustrated in FIG. 9) are provided in one chip. The sense IGBT is arranged close to the main IGBT (=800 μm). In this case, when an error occurs (for example, when overcurrent is generated), the current of the main IGBT flows to the sense IGBT, a large voltage drop occurs across a sense resistor, and the current of the main IGBT which is significantly greater than the actual current value is detected. In this case, the current of the main IGBT is reduced to a predetermined current value or less by the detected excessively large voltage drop across the sense resistor and the protective circuit performs a process of reducing the gate voltage at the gate terminal of the main IGBT such that the current of the main IGBT is reduced.

When the gate voltage of the main IGBT is reduced, the current of the main IGBT is reduced and the current which flows to the sense IGBT is also reduced. Then, since a voltage drop across the sense resistor is small, the protective circuit increases the gate voltage of the main IGBT such that the current of the main IGBT increases. Therefore, the current of the main IGBT increases. This feedback operation is repeated and the collector current of the main IGBT oscillates. When the collector current oscillates, an induced electromotive force is generated by the inductance of the ignition coil. Therefore, the collector voltage oscillates with a large amplitude and an ignition error occurs in the spark plug.

In contrast, in the structure in which the distance between the main IGBT and the sense IGBT is equal to or greater than 1500 μm, the current of the main IGBT flows to the sense IGBT when an error occurs and the voltage drop across the sense resistor does not overlap. Therefore, the collector voltage does not oscillate and it is possible to prevent the occurrence of an ignition error in the spark plug.

The amount of current (hole current) which flows from the main IGBT to the sense IGBT is reduced and the oscillation of a current waveform during soft turn-off is suppressed. The term "soft turn-off" is softly turning off the collector current of the main IGBT when an error occurs, such as when overcurrent is generated, to suppress a rapid increase in the collector voltage.

The following JP 7-245394 A discloses the following content. A main IGBT includes a sense IGBT with an overcurrent detection function. The sense IGBT is surrounded by a p well region for extracting holes. In particular, in FIG. 2 described in the following JP 7-245394 A, a sense IGBT region which has a substantially rectangular shape in a plan view and is which a plurality of sense IGBTs are arranged is adjacent to the main IGBT at the shortest distance in three directions which are perpendicular to three sides of the sense IGBT region. In one direction that is perpendicular to the remaining one side of the sense IGBT region, the sense IGBT region is arranged at a distance that is sufficiently greater than the shortest distance from the main IGBT and is adjacent to the main IGBT, with a p well region interposed therebetween. When the shortest distance between the sense IGBT region and the main IGBT is equal to or greater than 100 μm, the dependence of the sense ratio on the voltage is constant.

SUMMARY

Additional aspects and/or advantages will be set forth in part in the description which follows and, in part, will be apparent from the description, or may be learned by practice of the invention.

However, the above-mentioned techniques according to the related art have the following problems. When the depression IGBT 20 is added as illustrated in FIG. 9, the overshoot of the collector current Ic of the main IGBT 3 is suppressed to a small value during the limitation of the current even though the distance L between the sense IGBT 4 and the main IGBT 3 is about 1000 μm as illustrated in FIG. 10.

However, in order to meet the demand for reducing the size of the igniter 600, it is necessary to reduce the area of the semiconductor chip D1 having the IGBT unit 51 arranged therein. The provision of the depression IGBT 20 in the semiconductor chip D1 hinders a reduction in the size of the igniter. This is because the depression IGBT 20 has the excellent effect of suppressing the overshoot of the collector current Ic as described above, but the area of the depression IGBT 20 in the plane of the semiconductor chip D1 is relatively large.

In order to reduce the size and costs of the igniter, it is necessary to reduce the size of the multi-chip igniter 601 including the main IGBT 3, without providing the depression IGBT 20 in the multi-chip igniter 601. However, in the case in which the depression IGBT 20 is not provided, as described above, when an error occurs, that is, when overcurrent flows to the collector electrode, it is difficult to prevent a reduction in the collector current Ic and a rapid increase in the collector voltage VCE caused by the reduction in collector current Ic. Therefore, it is possible to newly add a protective function, instead of the depression IGBT 20, without increasing a chip area.

An object of embodiments of the invention is to provide an igniter and an igniter control method which can suppress the overshoot of a collector current when a current is limited and can reduce a size, in order solve the above-mentioned problems of the related art. In addition, another object of embodiments of the invention is to provide an internal combustion engine ignition apparatus which includes an igniter capable of suppressing the overshoot of a collector current when a current is limited, can prevent an ignition error, and can reduce a size, in order solve the above-mentioned problems of the related art.

In order to solve the above-mentioned problems and achieve the objects of embodiments of the invention, according to an aspect of the invention, there is provided a method for controlling an igniter including a main insulated gate transistor, a sense insulated gate transistor, and a control circuit. The method has the following characteristics. The main insulated gate transistor controls the flow of a main current. The sense insulated gate transistor is arranged in parallel to the main insulated gate transistor on the same semiconductor substrate as that on which the main insulated gate transistor is provided and detects a current value of the main insulated gate transistor. The control circuit calculates the current value of the main insulated gate transistor from a sense current value of the sense insulated gate transistor and controls a gate voltage of the main insulated gate transistor on the basis of the calculated current value of the main insulated gate transistor to control a current of the main insulated gate transistor. Before overcurrent flows to the main insulated gate transistor and a value of the overcurrent reaches a predetermined upper limit, the control circuit calculates the current value of the main insulated gate transistor from the sense current value of the sense insulated gate transistor and reduces the gate voltage such that the current of the main insulated gate transistor reaches the predetermined upper limit of the overcurrent.

In the method for controlling an igniter according to the above-mentioned aspect of the invention, before the overcurrent of the main insulated gate transistor reaches the predetermined upper limit, a sense current which flows to the sense insulated gate transistor may be saturated.

In order to solve the above-mentioned problems and achieve the objects of embodiments of the invention, an igniter according to another aspect of the invention has the following characteristics. A main insulated gate transistor that controls the flow of a main current is provided. A sense insulated gate transistor is provided which is arranged in parallel to the main insulated gate transistor on the same semiconductor substrate as that on which the main insulated gate transistor is provided and detects a current value of the main insulated gate transistor. A control circuit is provided which calculates the current value of the main insulated gate transistor from a sense current value of the sense insulated gate transistor and controls a gate voltage of the main insulated gate transistor on the basis of the calculated current value of the main insulated gate transistor to control the current of the main insulated gate transistor. The control circuit reduces the gate voltage output from the control circuit to limit overcurrent which flows to the main insulated gate transistor. The sense current which flows to the sense insulated gate transistor is in a saturation region at a time at which the control circuit reduces the gate voltage to the gate voltage value when the current of the main insulated gate transistor reaches the predetermined upper limit of the overcurrent.

In the igniter according to the above-mentioned aspect of the invention, a distance between the main insulated gate transistor and the sense insulated gate transistor may be equal to or greater than 100 μm and equal to or less than 700 μm.

In the igniter according to the above-mentioned aspect of the invention, the sense insulated gate transistor may be surrounded in a rectangular shape by a carrier extraction layer that extracts a carrier which flows from the main insulated gate transistor to the sense insulated gate transistor.

In order to solve the above-mentioned problems and achieve the objects of embodiments of the invention, an igniter according to still another aspect of the invention includes a main insulated gate transistor and a sense insulated gate transistor and has the following characteristics. The main insulated gate transistor includes a first semiconductor layer of a first conductivity type, a second semiconductor layer of a second conductivity type that is selectively provided in a surface layer of a first main surface of the first semiconductor layer, a third semiconductor layer of the first conductivity type that is selectively provided in the second semiconductor layer, a first gate electrode that is provided on a surface of a portion of the second semiconductor layer which is interposed between the third semiconductor layer and the first semiconductor layer, with a first gate insulating film interposed therebetween, and a first main electrode that is electrically connected to the second semiconductor layer and the third semiconductor layer. The sense insulated gate transistor includes a fourth semiconductor layer of the second conductivity type that is selectively provided in the surface layer of the first main surface of the first semiconductor layer so as to be separated from the second semiconductor layer, a fifth semiconductor layer of the first conductivity type that is selectively provided in the fourth semiconductor layer, a second gate electrode that is provided on a surface of a portion of the fourth semiconductor layer which is interposed between the fifth semiconductor layer and the first semiconductor layer, with a second gate insulating film interposed therebetween, and a second main electrode that is electrically connected to the first main electrode, the fourth semiconductor layer, and the fifth semiconductor layer. A distance between the main insulated gate transistor and the sense insulated gate transistor is equal to or greater than 100 μm and equal to or less than 700 μm.

In the igniter according to the above-mentioned aspect of the invention, the distance may be equal to or greater than 100 μm and equal to or less than 200 μm.

In the igniter according to the above-mentioned aspect of the invention, the sense insulated gate transistor may be surrounded in a rectangular shape by a carrier extraction layer that extracts a carrier which flows from the main insulated gate transistor to the sense insulated gate transistor.

In the igniter according to the above-mentioned aspect of the invention, the main insulated gate transistor may have a polygonal shape in a plan view which has an L-shaped portion formed by two adjacent sides or a concave portion formed by three adjacent sides that face the sense insulated gate transistor so as to surround a portion of the edge of the sense insulated gate transistor.

The igniter according to the above-mentioned aspect of the invention may further include a surge protective sense zener diode that is provided on the first main surface of the first semiconductor layer and is connected between the second gate electrode and the first main electrode and an asymmetric bidirectional diode that is provided on the first main surface of the first semiconductor layer and is connected between the first main electrode and the second main electrode and sets the potential of the second main electrode to be higher than the potential of the first main electrode. Each of the sense zener diode and the asymmetric bidirectional diode may be arranged so as to face a portion of the sense insulated gate transistor that does not face the main insulated gate transistor.

In the igniter according to the above-mentioned aspect of the invention, the main insulated gate transistor and the sense insulated gate transistor may be arranged such that the first main electrode and the second main electrode are connected through an electrode of the asymmetric bidirectional diode.

In the igniter according to the above-mentioned aspect of the invention, a planar area of the sense zener diode may be greater than a planar area of the asymmetric bidirectional diode.

The igniter according to the above-mentioned aspect of the invention may be a multi-chip igniter including a first semiconductor chip in which at least the main insulated gate transistor and the sense insulated gate transistor are formed and a second semiconductor chip in which a control circuit that controls the main insulated gate transistor and the sense insulated gate transistor is formed.

The igniter according to the above-mentioned aspect of the invention may be a one-chip igniter in which at least the main insulated gate transistor, the sense insulated gate transistor, and a control circuit that controls the main insulated gate transistor and the sense insulated gate transistor are formed in the same semiconductor chip.

In the igniter according to the above-mentioned aspect of the invention, the main insulated gate transistor and the sense insulated gate transistor may be insulated gate bipolar transistors including a sixth semiconductor layer of the second conductivity type that is provided on a second main surface of the first semiconductor layer and a third main electrode that is electrically connected to the sixth semiconductor layer.

In the igniter according to the above-mentioned aspect of the invention, the main insulated gate transistor and the sense insulated gate transistor may be insulated gate field effect transistors including a sixth semiconductor layer of the first conductivity type that is provided on a second main surface of the first semiconductor layer and a third main electrode that is electrically connected to the sixth semiconductor layer.

In the igniter according to the above-mentioned aspect of the invention, the main insulated gate transistor may have a planar gate structure or a trench gate structure in which the first gate electrode is provided in a trench that extends to the first semiconductor layer through the third semiconductor layer and the second semiconductor layer, with the first gate insulating film interposed therebetween.

In the igniter according to the above-mentioned aspect of the invention, the sense insulated gate transistor may have a planar gate structure or a trench gate structure in which the second gate electrode is provided in a trench that extends to the first semiconductor layer through the fifth semiconductor layer and the fourth semiconductor layer, with the second gate insulating film interposed therebetween.

The igniter according to the above-mentioned aspect of the invention may further include a control circuit that reduces a gate voltage of the main insulated gate transistor to limit overcurrent which flows to the main insulated gate transistor. A sense current which flows to the sense insulated gate transistor may be in a saturation region at a time at which the control circuit reduces the gate voltage to the gate voltage value when a current of the main insulated gate transistor reaches a predetermined upper limit of the overcurrent.

The igniter according to the above-mentioned aspect of the invention may further include a control circuit that, before overcurrent flows to the main insulated gate transistor and a value of the overcurrent reaches a predetermined upper limit, calculates a current value of the main insulated gate transistor from a sense current value of the sense insulated gate transistor and reduces a gate voltage of the main insulated gate transistor such that the current of the main insulated gate transistor reaches a predetermined upper limit of the overcurrent.

An internal combustion engine ignition apparatus according to yet another aspect of the invention includes the igniter according to the above-mentioned aspect of the invention.

In order to solve the above-mentioned problems and achieve the object of embodiments of the invention, an internal combustion engine ignition apparatus according to still yet another aspect of the invention includes an igniter including a main insulated gate transistor, a sense insulated gate transistor, and a control circuit and has the following characteristics. The main insulated gate transistor controls the flow of a main current. The sense insulated gate transistor is arranged in parallel to the main insulated gate transistor on the same semiconductor substrate as that on which the main insulated gate transistor is provided and detects a current value of the main insulated gate transistor. The control circuit calculates the current value of the main insulated gate transistor from a sense current value of the sense insulated gate transistor and controls a gate voltage of the main insulated gate transistor on the basis of the calculated current value of the main insulated gate transistor to control a current of the main insulated gate transistor. The igniter is controlled such that, before overcurrent flows to the main insulated gate transistor and a value of the overcurrent reaches a predetermined upper limit, the control circuit calculates the current value of the main insulated gate transistor from the sense current value of the sense insulated gate transistor and reduces the gate voltage so that the current of the main insulated gate transistor reaches the predetermined upper limit of the overcurrent.

In the internal combustion engine ignition apparatus according to the above-mentioned aspect of the invention, the igniter may be controlled such that, before the overcurrent of the main insulated gate transistor reaches the predetermined upper limit, a sense current which flows to the sense insulated gate transistor is saturated.

EFFECTS

According to the igniter, the igniter control method, and the internal combustion engine ignition apparatus of embodiments of the invention, it is possible to prevent the overshoot of a collector current of a main IGBT when a current is limited, without providing a depression IGBT.

Furthermore, according to the igniter, the igniter control method, and the internal combustion engine ignition apparatus of embodiments of the invention, since a depression IGBT is not provided, it is possible to reduce the size of an igniter. In addition, it is possible to provide an internal combustion engine ignition apparatus which has a small size, can suppress the overshoot of a collector current of a main IGBT, and can prevent an ignition error.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1:
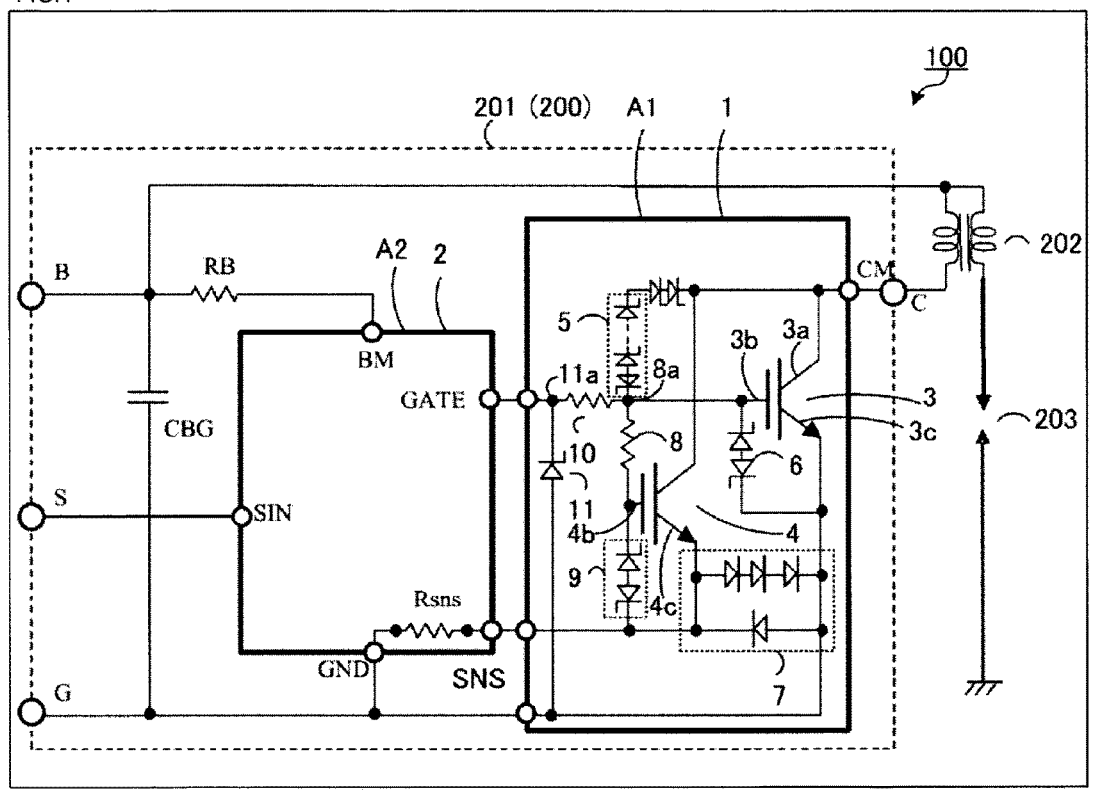
FIG. 1 is a circuit diagram illustrating the circuit structure of a main portion of an internal combustion engine ignition apparatus 100 according to Embodiment 1 of the invention.

Hereinafter, preferred embodiments of an igniter, an igniter control method, and an internal combustion engine ignition apparatus according to the invention will be described in detail with reference to the accompanying drawings, using the following examples. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In the invention, the same components as those in the related art are denoted by the same reference numerals. In addition, in the specification, the terms "saturate" and "saturation region" mean a "saturation region" in the known MOSFET. That is, the term "saturation region" means that a depletion layer of a channel is pinched off and a collector current is constantly maintained with an increase in the voltage between the collector (C) and the emitter (E) and a region in which the collector current is constant. In the specification, the term "linear region" means a region in which the collector current increases with an increase in the voltage between C and E and a region in which the collector current reaches the above-mentioned saturation region.

<Embodiment 1>

The structure of an internal combustion engine ignition apparatus according to Embodiment 1 will be described. FIG. 1 is a circuit diagram illustrating the circuit structure of a main portion of an internal combustion engine ignition apparatus 100 according to Embodiment 1 of the invention. FIG. 1 also illustrates the main circuit of a multi-chip igniter 201 which is provided in the internal combustion engine ignition apparatus 100. In this embodiment, a main IGBT 3 and a sense IGBT 4 are given as examples of elements forming an IGBT unit 1 and may be insulated gate field effect transistors (MOSFET: metal oxide semiconductor field effect transistors). In this case, an $n^+$ drain layer (sixth semiconductor layer) and a drain electrode (third main electrode) may be provided instead of a $p^+$ collector layer and a collector electrode, which will be described below. In addition, the multi-chip igniter 201 is a kind of igniter 200 and includes two semiconductor chips A1 and A2.

The internal combustion engine ignition apparatus 100 includes the igniter 200 (general term), an ignition coil 202, and a spark plug 203. The igniter 200 includes the IGBT unit 1, a control IC unit (control circuit) 2, a battery resistor RB, and a capacitor CBG.

In FIG. 1, the IGBT unit 1 formed in the semiconductor chip A1 includes the main IGBT 3, the sense IGBT 4, and a G-C zener diode 5. The main IGBT 3 has a function of blocking a primary current which flows to the primary side of the ignition coil 202. The sense IGBT 4 detects (senses) a current which flows to the main IGBT 3. The sense IGBT 4 includes a collector 3a which is shared by the main IGBT 3. The G-C zener diode 5 is connected between the collector 3a of the sense IGBT 4 and the main IGBT 3 and a gate 3b of the main IGBT 3. The G-C zener diode 5 has a function of clamping a collector voltage VCE of the sense IGBT 4 and the main IGBT 3.

Figure 17:
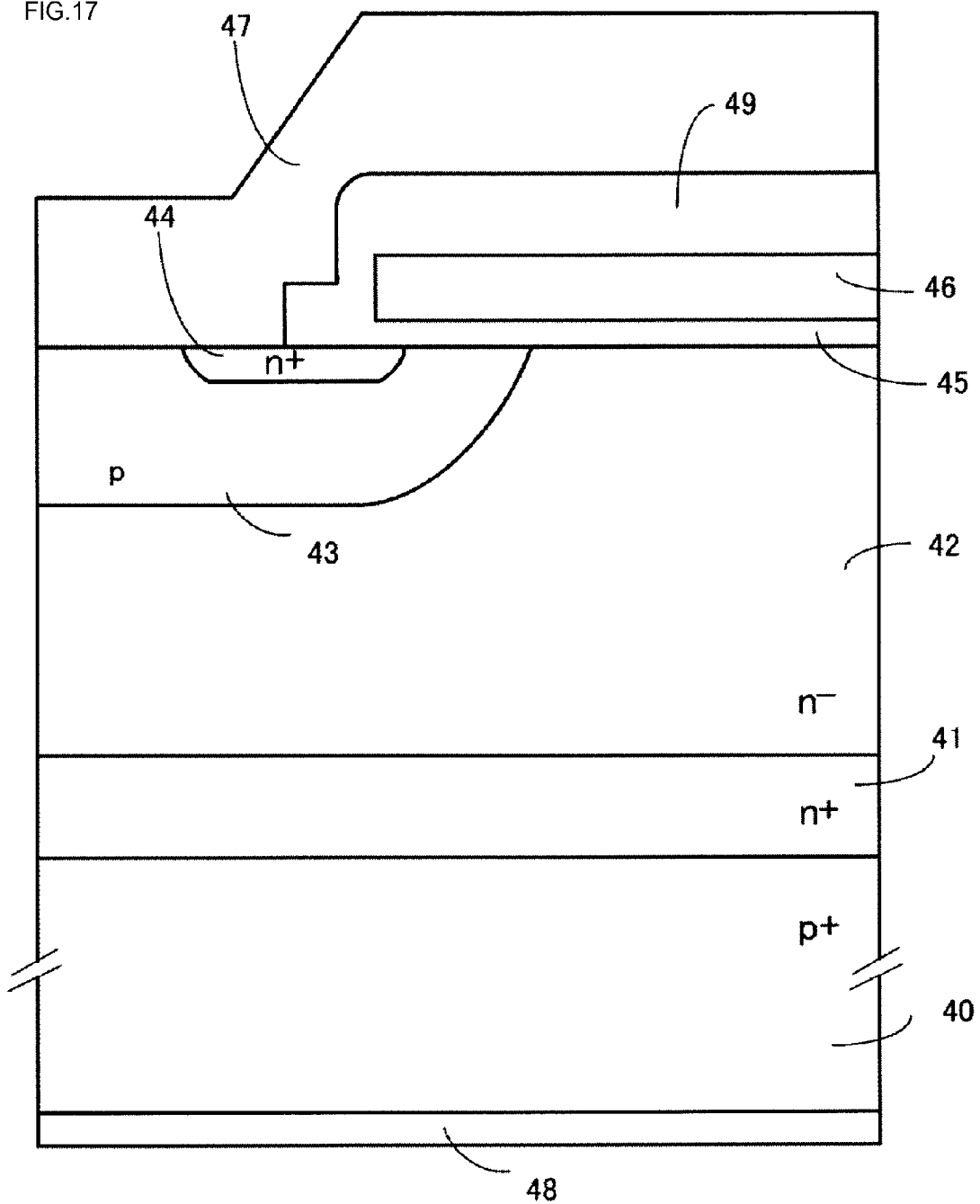
FIG. 17 is a cross-sectional view illustrating the structure of an IGBT forming the igniter 200 according to embodiments of the invention.

FIG. 17 illustrates the structure of a unit cell of the IGBT which is formed in the IGBT unit 1 of the semiconductor chip A1 of the igniter 200. FIG. 17 is a cross-sectional view illustrating the structure of the IGBT forming the igniter 200 according to embodiments of the invention. In the main IGBT 3 and the sense IGBT 4, for example, the unit cells having the same structure are arranged in parallel in the same semiconductor chip A1. The structure of the unit cell will be described in detail. An $n^+$ buffer layer 41 and an $n^-$ drift layer (first semiconductor layer) 42 are sequentially formed as epitaxial layers on a front surface of a high-concentration semiconductor substrate which will be a $p^+$ collector layer (sixth semiconductor layer) 40. A p base layer (second and fourth semiconductor layers) 43 is selectively formed in a surface layer of the $n^-$ drift layer 42 which is opposite to the $n^+$ buffer layer 41. An $n^+$ emitter layer 44 is selectively formed in the p base layer 43.

A gate insulating film (first and second gate insulating films) 45 is formed on the surfaces of the $n^+$ emitter layer (third and fifth semiconductor layers) 44, the p base layer 43, and the $n^-$ drift layer 42, which are adjacent to each other, so as to be laid across them and a gate electrode 46 (first and second gate electrodes) is formed on the gate insulating film 45. In this way, the known MOS gate structure is formed. An emitter electrode (first and second main electrode) 47 comes into contact with the $n^+$ emitter layer 44 and the p base layer 43 and is electrically insulated from the gate electrode 46 by an interlayer insulating film 49. In order to reduce contact resistance, a p-type high-concentration contact layer may be formed in the p base layer 43 so as to come into contact with the emitter electrode 47. A collector electrode (third main electrode) 48 is formed on the surface of the $p^+$ collector layer 40 (the rear surface of the high-concentration semiconductor substrate). The thickness and impurity concentration of the $n^-$ drift layer 42 are determined by, for example, the rated voltage of the element. The rated voltage is in the range of, for example, 400 V to 600 V.

Returning to FIG. 1, the IGBT unit 1 further includes a surge protective G-E zener diode 6, a diode 7 (asymmetric bidirectional zener diode), a resistor 8, a surge protective sense G-E zener diode 9, a surge protective resistor 10, and a surge protective zener diode 11. The G-E zener diode 6 is connected between the gate 3b and an emitter 3c of the main IGBT 3. The diode 7 is connected between the emitter 3c of the main IGBT 3 and an emitter 4c of the sense IGBT 4. The diode 7 has a function of setting the emitter voltage of the sense IGBT 4 to be higher than the emitter voltage of the main IGBT 3.

The resistor 8 is connected to the gate 3b of the main IGBT 3 and a gate 4b of the sense IGBT 4. The resistor 8 has a function of setting the gate voltage of the sense IGBT 4 to be less than the gate voltage VGE of the main IGBT 3. The sense G-E zener diode 9 is connected between the gate 4b and the emitter 4c of the sense IGBT 4. One end of the resistor 10 is connected to a connection point 8a among the gate 3b of the main IGBT 3, the G-C zener diode 5, and the resistor 8. The zener diode 11 is connected to the other end of the resistor 10 and the ground. A connection point 11a between the resistor 10 and the zener diode 11 is connected to a gate terminal GATE of the control IC unit 2. The emitter 4c of the sense IGBT 4 is connected to a sense terminal SNS of the control IC unit 2. The diodes and the resistors forming the IGBT unit 1 are arranged on, for example, the front surface of the semiconductor chip A1.

The control IC unit 2 formed in the semiconductor chip A2 includes, for example, a sense resistor Rsns, the sense terminal SNS, the gate terminal GATE, a battery terminal BM, a control terminal SIN, and a ground terminal GND. For example, a current limiting circuit and an overheat detection circuit which are not illustrated are formed in the control IC unit 2.

The battery terminal BM is connected to a battery terminal B of the multi-chip igniter 201 through the battery resistor RB. In addition, a connection point between the battery resistor RB and a capacitor CBG is connected to one end of the ignition coil 202.

The control terminal SIN of the control IC unit 2 is connected to a control terminal S of the multi-chip igniter 201. The ground terminal GND of the control IC unit 2 is connected to a ground terminal G of the multi-chip igniter 201. The collector 3a of the main IGBT 3 is connected to a collector terminal CM of the IGBT unit 1. The collector terminal CM of the IGBT unit 1 is connected to a collector terminal C of the multi-chip igniter 201.

The collector terminal C of the multi-chip igniter 201 is connected to the primary end of the ignition coil 202. The secondary end of the ignition coil 202 is connected to one end of the spark plug 203. The other end of the spark plug 203 is connected to the ground.

The battery terminal B of the multi-chip igniter 201 is connected to an external battery. The control terminal S of the multi-chip igniter 201 is connected to an engine control unit (ECU) (not illustrated). The ground terminal G of the multi-chip igniter 201 is connected to the external ground.

Figure 2:
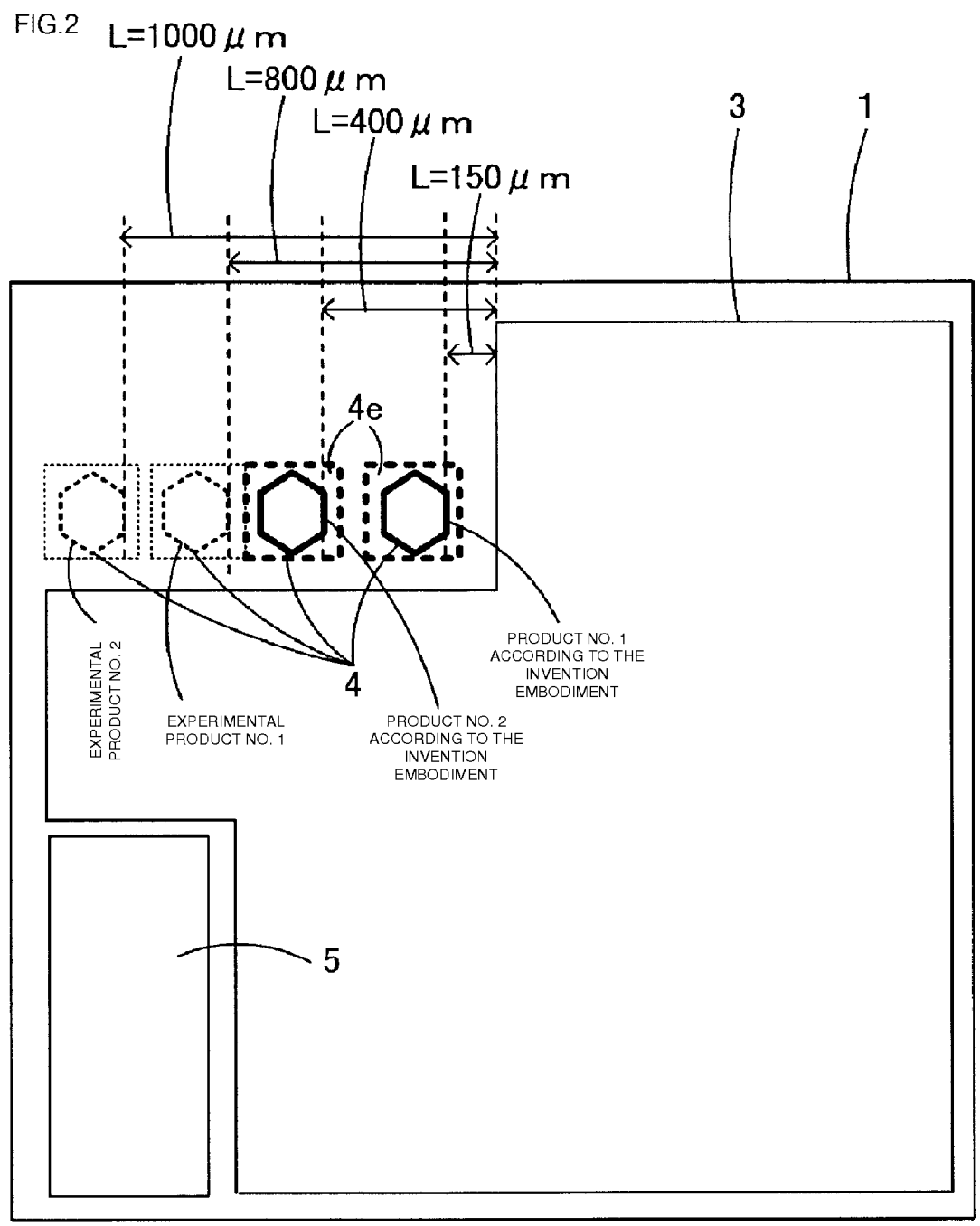
FIG. 2 is a plan view illustrating the planar arrangement of a main IGBT 3 and a sense IGBT 4 of an IGBT unit 1 forming a multi-chip igniter 201 illustrated in FIG. 1.

Next, the arrangement of the main IGBT 3 and the sense IGBT 4 in the IGBT unit 1 forming the multi-chip igniter 201 (a product according to embodiments of the invention) will be described. FIG. 2 is a plan view illustrating the planar arrangement of the main IGBT 3 and the sense IGBT 4 in the IGBT unit 1 forming the multi-chip igniter 201 illustrated in FIG. 1. FIG. 2 illustrates two products according to embodiments of the invention (hereinafter, referred to as products No. 1 and No. 2 according to embodiments of the invention). The products No. 1 and No. 2 according to embodiments of the invention are different from each other in a distance L between the sense IGBT 4 and the main IGBT 3. In FIG. 2, the products No. 1 and No. 2 according to embodiments of the invention are illustrated in one figure in order to clarify a difference in the distance L between the sense IGBT 4 and the main IGBT 3. However, the products No. 1 and No. 2 according to embodiments of the invention are examples of different multi-chip igniters 201. That is, each of the products No. 1 and No. 2 according to embodiments of the invention has one sense IGBT 4 and one main IGBT 3. Among four sense IGBTs 4 illustrated in FIG. 2, the rightmost sense IGBT is the sense IGBT 4 of the product No. 1 according to embodiments of the invention and the sense IGBT on the left side of the product No. 1 according to embodiments of the invention is the sense IGBT 4 of the product No. 2 according to embodiments of the invention.

As illustrated in FIG. 2, the main IGBT 3 has, for example, a concave polygonal shape in a plan view in which at least one interior angle (reentrant corner) is greater than 180 degrees and an L-shaped portion that is concave inward is formed by two sides 31 and 32 forming the interior angle. In the products No. 1 and No. 2 according to embodiments of the invention, the sense IGBT 4 is arranged close to the main IGBT 3 so as to face two sides that form the interior angle of the reentrant corner. Specifically, in the product No. 1 according to embodiments of the invention, for example, the distance L between the sense IGBT 4 and one of the sides that form the interior angle of the reentrant corner of the main IGBT 3 is about 150 μm. In the product No. 2 according to embodiments of the invention, for example, the distance L between the sense IGBT 4 and one of the sides that form the interior angle of the reentrant corner of the main IGBT 3 is about 400 μm.

In FIG. 2, experimental products No. 1 and No. 2 illustrated in FIG. 11(b), which will be described below, are represented by a dotted line for reference. Among four sense IGBTs 4 illustrated in FIG. 2, a sense IGBT 4 of the experimental product No. 1 is arranged on the left side of the product No. 2 according to embodiments of the invention and a sense IGBT 4 of the experimental product No. 2 is arranged on the leftmost side. In the experimental product No. 1, the distance L between the sense IGBT 4 and one of the sides that form the interior angle of the reentrant corner of the main IGBT 3 is 800 μm. In the experimental product No. 2, the distance L between the sense IGBT 4 and one of the sides that form the interior angle of the reentrant corner of the main IGBT 3 is 1000 μm. That is, in both the products No. 1 and No. 2 according to embodiments of the invention, the sense IGBT 4 is arranged closer to two sides that form the interior angle of the reentrant corner of the main IGBT 3 than that in the experimental products No. 1 and No. 2.

Figure 15:
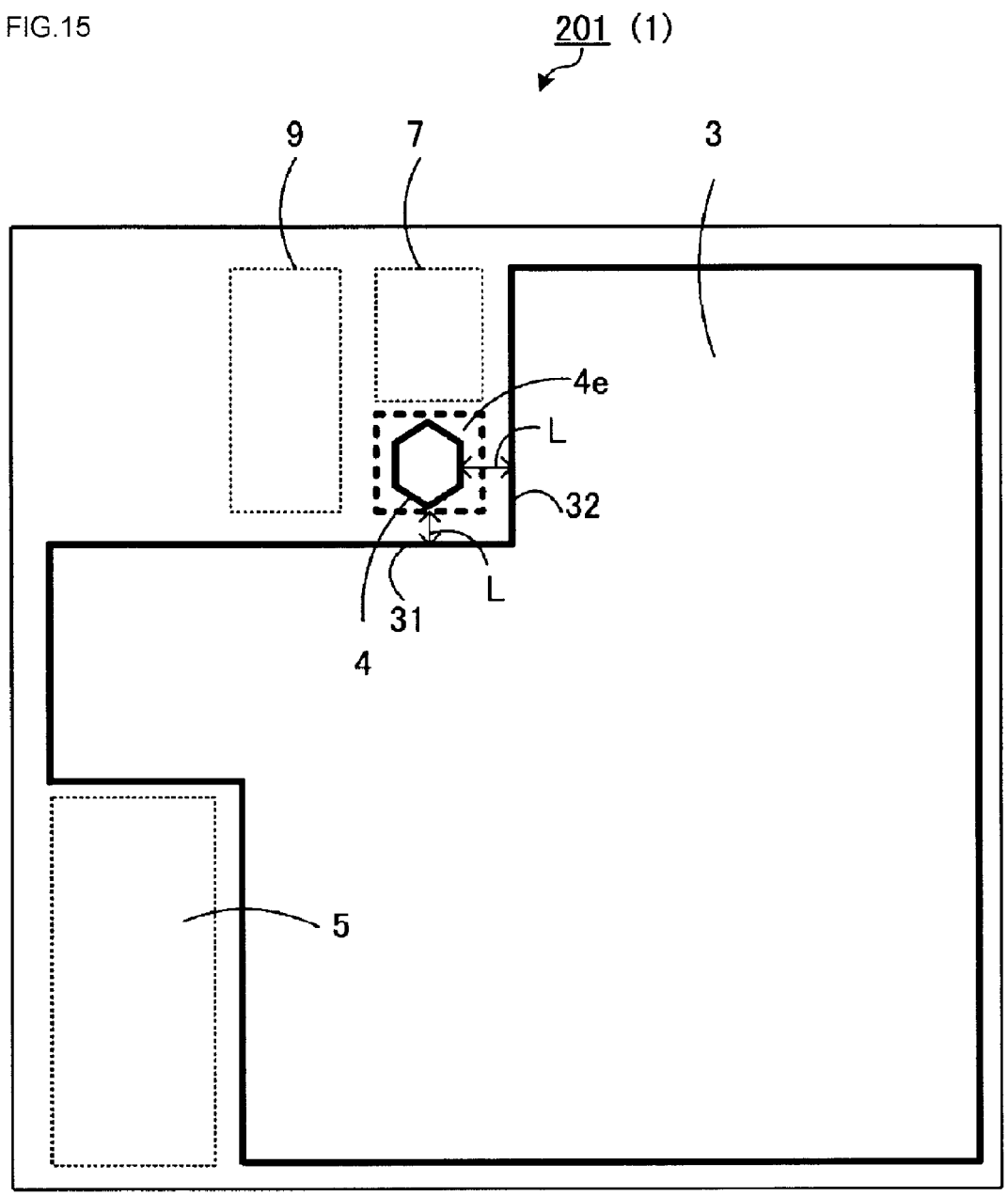
FIG. 15 is a plan view illustrating the planar arrangement of a main portion of an IGBT unit 1 forming an igniter 200 according to embodiments of the invention.

FIG. 15 illustrates an example of the arrangement of the components that are formed in the semiconductor chip A1 in the multi-chip igniter 201 illustrated in FIG. 1. FIG. 15 is a plan view illustrating the planar arrangement of a main portion of the IGBT unit 1 forming the igniter 200 according to embodiments of the invention. FIG. 15 illustrates the product No. 1 according to embodiments of the invention. The sense IGBT 4 is arranged close to the main IGBT 3 so as to face two sides 31 and 32 (two sides) that form the interior angle of the reentrant corner of the main IGBT 3. The distance L between each of the two sides 31 and 32 of the main IGBT 3 and the sense IGBT 4 is, for example, about 150 μm. As such, when the sense IGBT 4 is arranged close to the main IGBT 3 so as to face two sides (or one side), it is possible to stabilize the sense ratio (=a collector current Ic/a sense current Isns).

Figure 16:
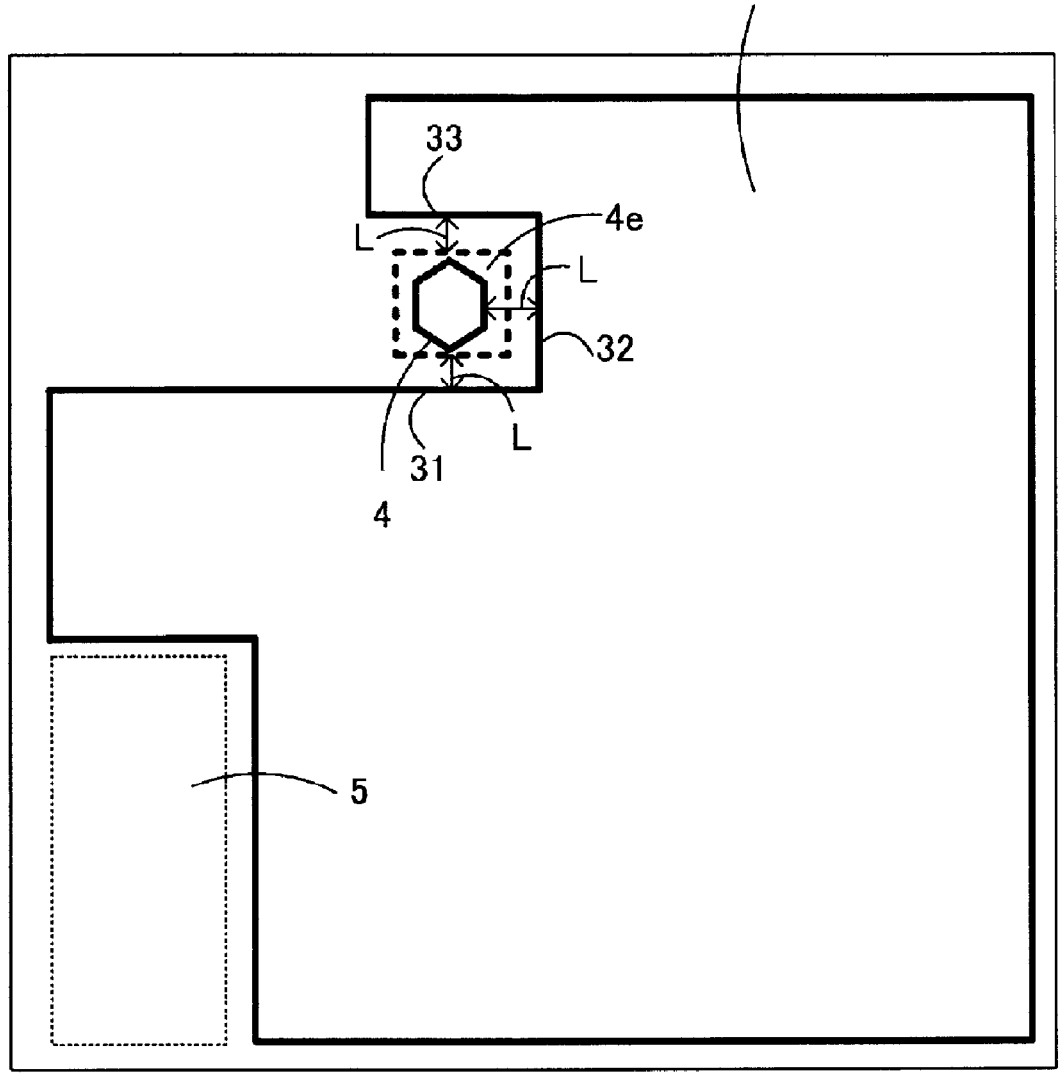
FIG. 16 is a plan view illustrating the planar arrangement of a main portion of another example of the IGBT unit 1 forming the igniter 200 according to embodiments of the invention.

FIG. 16 illustrates another example of the arrangement of the components which are formed in the semiconductor chip A1 in the multi-chip igniter 201 illustrated in FIG. 1. FIG. 16 is a plan view illustrating the planar arrangement of a main portion of another example of the IGBT unit 1 forming the igniter 200 according to embodiments of the invention. In FIG. 16, the diode 7 and the sense G-E zener diode are not illustrated. FIG. 16 illustrates a product No. 3 according to embodiments of the invention. The product No. 3 according to embodiments of the invention differs from the sense IGBT 4 of the product No. 1 according to embodiments of the invention illustrated in FIG. 15 in the positional relationship between the sense IGBT 4 and the main IGBT 3. Specifically, the main IGBT 3 has, for example, a concave polygonal shape in a plan view in which at least two adjacent interior angles form a reentrant corner and a concave portion that is concave inward is formed by three sides 31, 32, and 33 forming the two interior angles. The sense IGBT 4 is arranged close to the main IGBT 3 so as to face the three sides 31, 32, and 33 that form two adjacent interior angles forming the reentrant corner. The distance L between each of the three sides 31, 32, and 33 of the main IGBT 3 and the sense IGBT 4 is, for example, about 150 μm.

When the three sides 31, 32, and 33 of the main IGBT 3 are close to the sense IGBT 4, the sense current Isns flows and the sense ratio is reduced. When the sense ratio is reduced, it is possible to reduce the peak value Ip of the collector current Ic and thus to reduce the secondary voltage (overshoot voltage) of the ignition coil 202. Therefore, a large amount of current flows from the main IGBT 3 to the sense IGBT 4. As a result, there is a concern that the sense ratio will not be stabilized. When the three sides 31, 32, and 33 of the main IGBT 3 are close to the sense IGBT 4, the impurity concentration of the n$^+$ buffer layer 41 (see FIG. 17) may have particularly a relatively high value. Specifically, the impurity concentration of the n$^+$ buffer layer 41 is, for example, equal to or greater than $5\times10^{16}$/cm$^3$ and less than the impurity concentration of the p$^+$ collector layer 40, preferably, equal to or less than $1\times10^{18}$/cm$^3$. In addition, the thickness of the n$^+$ buffer layer 41 is, for example, equal to or greater than about 15 μm and equal to or less than about 30 μm. When the n$^+$ buffer layer 41 has high impurity concentration and the above-mentioned thickness, the injection of holes from the p$^+$ collector layer 40 is suppressed and the amount of hole current which flows into the sense IGBT 4 is reduced. Therefore, it is possible to stabilize the sense ratio.

A p$^+$ extraction region 4e which extracts holes is provided with a width of, for example, about 50 μm to 100 μm around the sense IGBT 4. The p$^+$ extraction region 4e has, for example, a rectangular shape in a plan view. For example, in the case of the multi-chip igniter 201 illustrated in FIG. 15, two adjacent sides of the p$^+$ extraction region 4e which has a rectangular shape in a plan view face the two sides 31 and 32 of the main IGBT 3, respectively. For example, in the case of the multi-chip igniter 201 illustrated in FIG. 16, three adjacent sides of the p$^+$ extraction region 4e which has a rectangular shape in a plan view face the three sides 31, 32, and 33 of the main IGBT 3, respectively. The arrangement of the p$^+$ extraction region 4e around the sense IGBT 4 is effective to increase the sense ratio to 100 or more. In addition, a large number of holes flow into the sense IGBT 4 and the latch-up of the sense IGBT 4 is prevented. The p$^+$ extraction region 4e may not be provided when the sense ratio is not important or when the latch-up is less likely to occur.

In FIG. 15, the sense G-E zener diode 9 is connected to the gate 4b (gate electrode) and the emitter 4c of the sense IGBT 4. The occupation area of the sense G-E zener diode 9 is less than that of the diode 7. As illustrated in FIG. 1, one end of the sense G-E zener diode 9 and one end of the diode 7 are both connected to the emitter 4c of the sense IGBT 4. The other end of the diode 7 is connected to the emitter 3c of the main IGBT 3. Therefore, the main IGBT 3, the sense IGBT 4, the sense G-E zener diode 9, and the diode 7 need to be arranged so as to be close to each other. That is, the diode 7 and the sense G-E zener diode 9 are arranged so as to face a portion of the sense IGBT 4 which does not face the main IGBT 3. The sense G-E zener diode 9 and the diode 7 which are arranged close to the sense IGBT 4 form, for example, a protective circuit of the sense IGBT 4.

Figure 10:
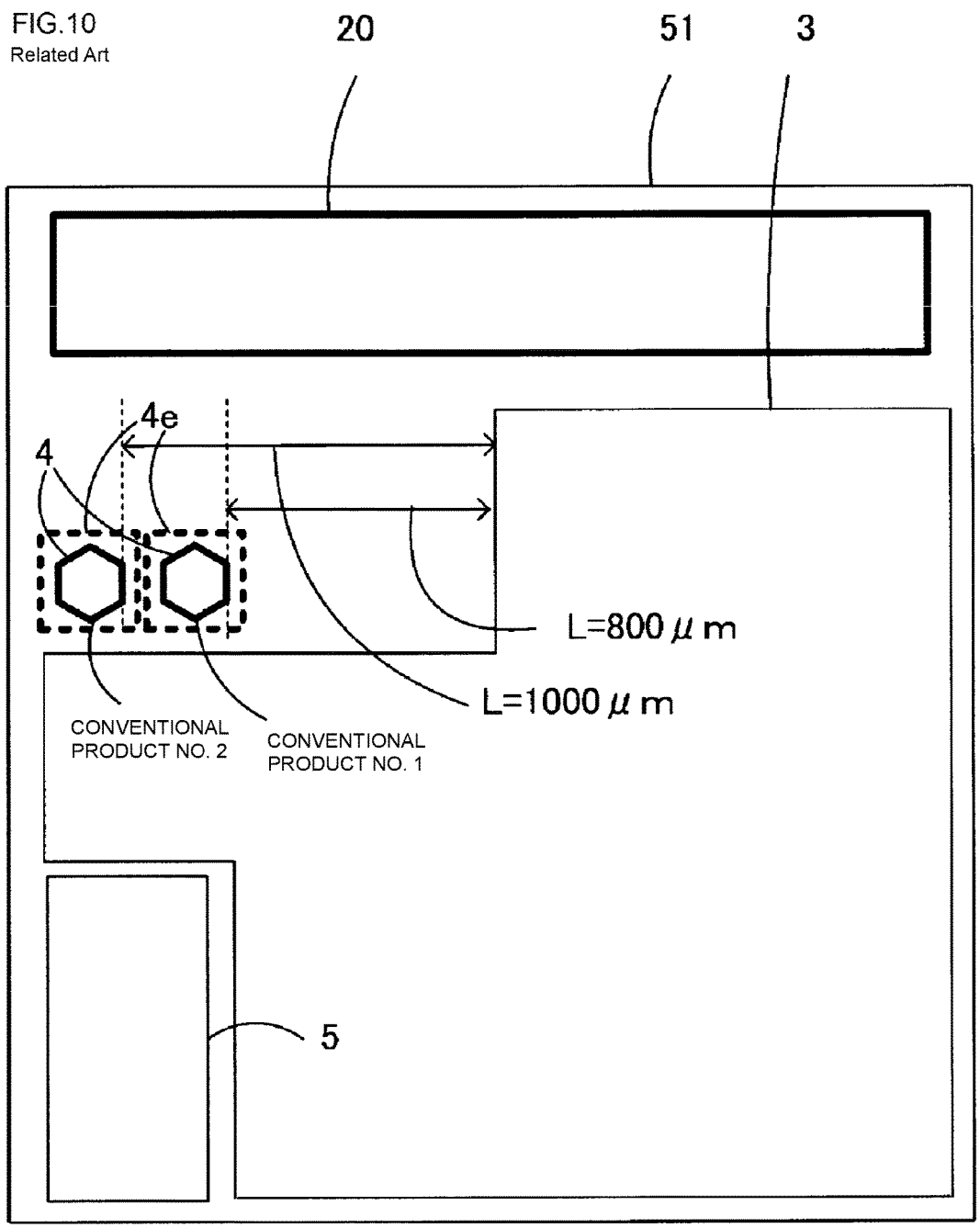
FIG. 10 is a plan view illustrating the planar arrangement of a main IGBT 3 and a sense IGBT 4 illustrated in FIG. 9.

Next, in the description of the operation of the igniter 200 according to embodiments of the invention, first, the operation of an experimental multi-chip igniter 801 and an experimental multi-chip igniter 801 which are comparative examples will be described. The inventors manufactured (produced) the experimental multi-chip igniter 801 with a structure in which the depression IGBT 20 was removed from the multi-chip igniter 601 (the conventional products No. 1 and No. 2 illustrated in FIG. 10). As the multi-chip igniter 801, two experimental products, that is, an experimental product No. 1 corresponding to the conventional product No. 1 and an experimental product No. 2 corresponding to the conventional product No. 2 were prepared. The experimental products No. 1 and No. 2 have the same structure as the conventional products No. 1 and No. 2 except that the depression IGBT 20 was not provided, respectively.

Figure 11:
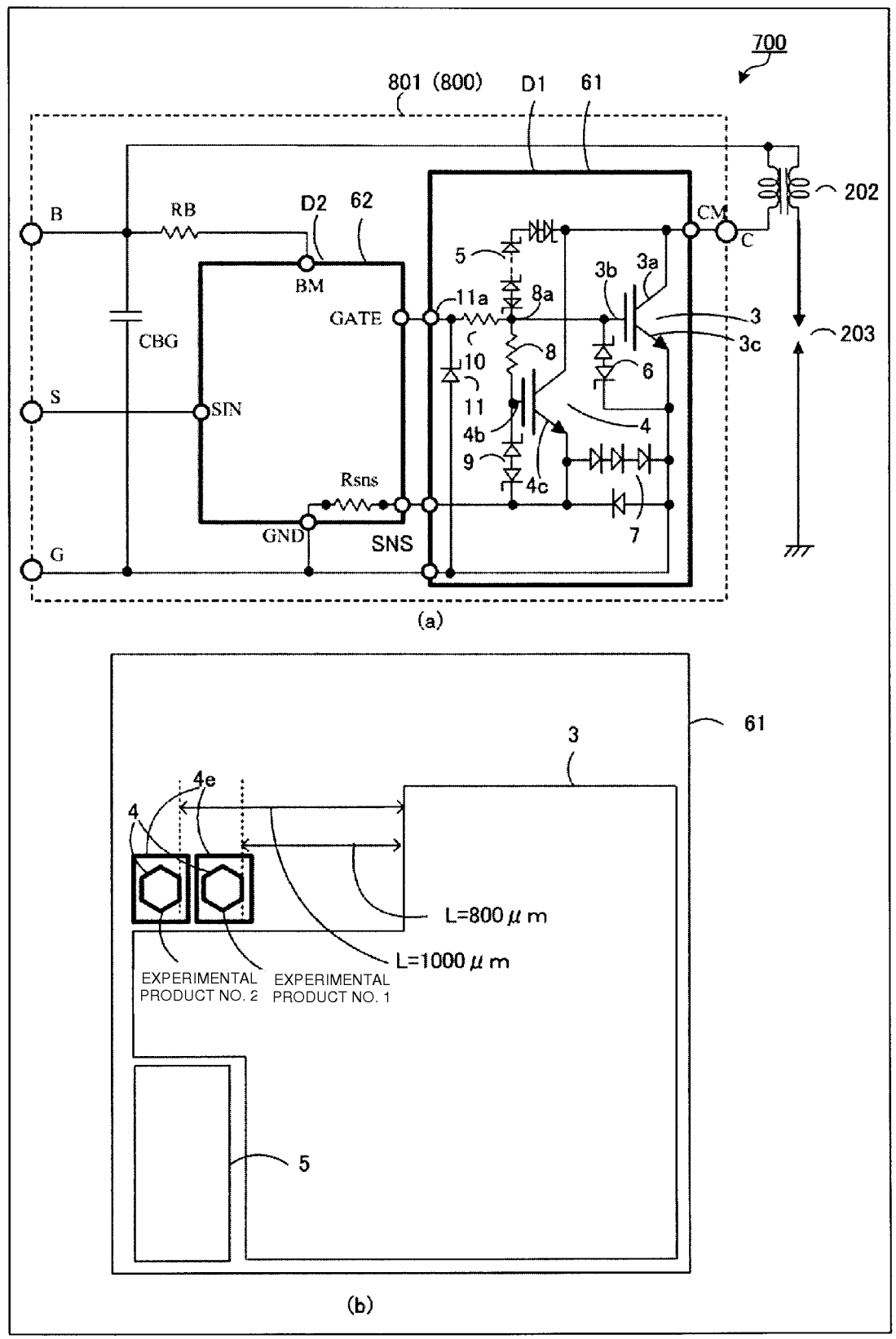
FIG. 11 is a diagram illustrating the structure of an experimental internal combustion engine ignition apparatus 700 including an experimental multi-chip igniter 801.

FIG. 11 is a diagram illustrating the structure of an experimental internal combustion engine ignition apparatus 700 provided with the experimental multi-chip igniter 801 (experimental product). FIG. 11(a) illustrates the circuit structure of a main portion of the internal combustion engine ignition apparatus 700. FIG. 11(b) illustrates the planar arrangement of a main IGBT 3 and a sense IGBT 4 in an IGBT unit 61 forming the multi-chip igniter 801. In FIG. 11(b), the experimental products No. 1 and No. 2 are illustrated in one figure in order to clarify a difference in the distance L between the sense IGBT 4 and the main IGBT 3. However, the experimental products No. 1 and No. 2 are examples of different multi-chip igniters 801. Of two sense IGBTs 4 illustrated in FIG. 11, the right sense IGBT is a sense IGBT 4 of the experimental product No. 1 and the left sense IGBT is a sense IGBT 4 of the experimental product No. 2. In FIG. 11, reference numeral 61 indicates an IGBT unit, reference numeral 62 indicates a control IC unit, reference numeral 800 indicates an igniter (general term), and reference numeral 801 indicates a multi-chip igniter. The depression IGBT 20 is not provided.

Figure 12:
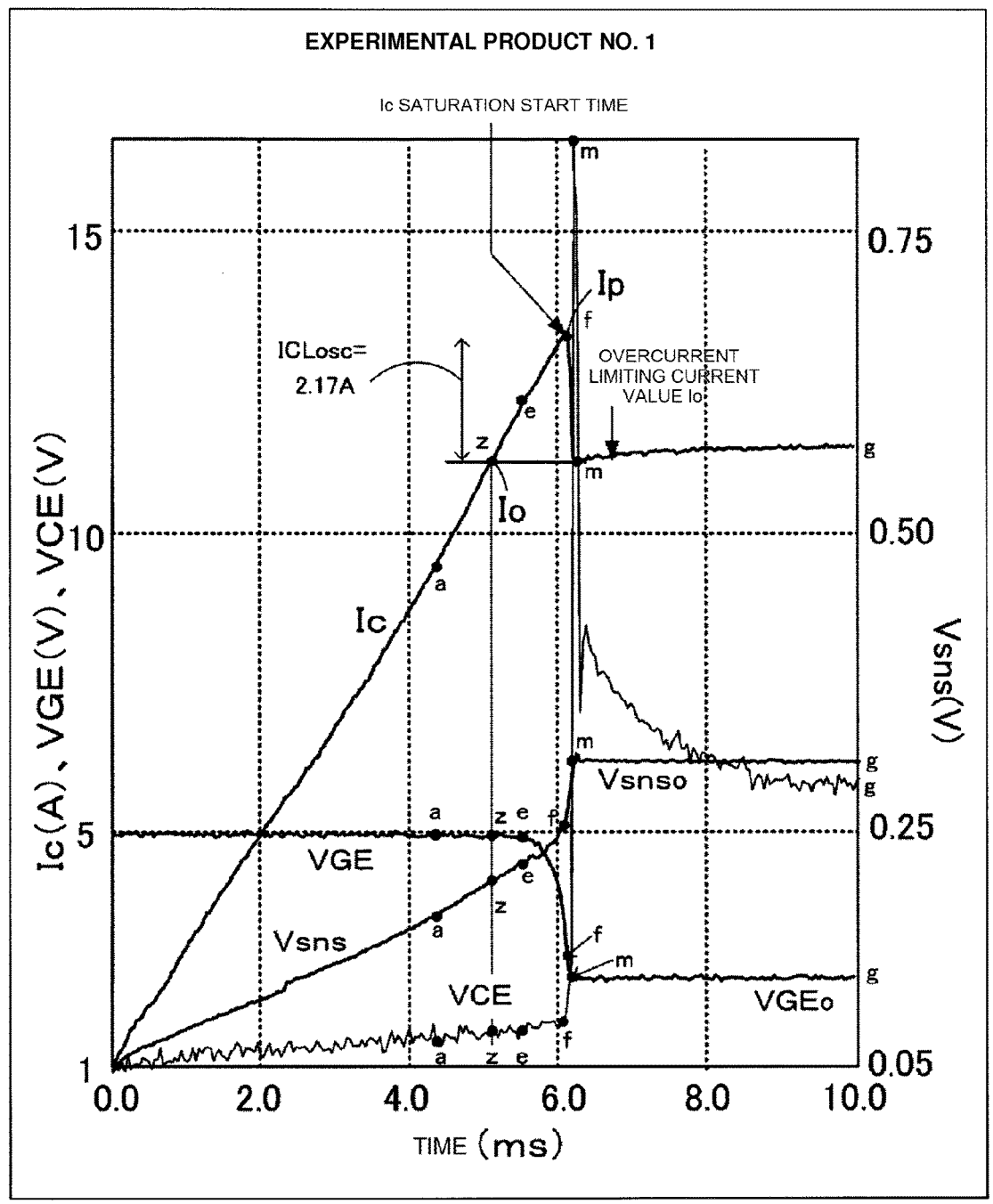
FIG. 12 is a characteristic diagram illustrating an operation waveform when the current of an experimental product No. 1 is limited.

FIG. 12 is a characteristic diagram illustrating operation waveforms (current and voltage waveforms) when the current of the experimental product No. 1 is limited. FIG. 12 illustrates the operation waveforms of the collector current Ic of the main IGBT 3, the sense voltage Vsns which is generated by the product of the sense current Isns and the sense resistor Rsns of the sense IGBT 4, the collector voltage VCE of the main IGBT 3, and the gate voltage VGE of the main IGBT 3 when the current of the experimental product No. 1 is limited. In FIG. 12, arbitrary times while the experimental product No. 1 is operating are sequentially represented by letters a, z, e, f, m, and g over time (which holds for FIG. 13).

In the main IGBT 3 of the experimental product No. 1, the sense voltage Vsns increases at a time f (in the vicinity of the peak value Ip of the collector current Ic) that is about 6 ms after the time when the collector current Ic of the main IGBT 3 starts to be saturated and is then saturated at Vsnso. The saturated sense voltage (hereinafter, referred to as a saturation sense voltage) Vsnso is input to an operational amplifier forming a current limiting circuit (not illustrated) that is provided in the control IC unit 62 and is compared with a comparison voltage Vref of the operational amplifier. Then, an overcurrent limiting current value Io of the collector current Ic is calculated from the comparison between the comparison voltage Vref of the operational amplifier and the saturation sense voltage Vsnso and a gate voltage (hereinafter, referred to as a gate voltage specific value) VGEo at which the collector current Ic with the overcurrent limiting current value Io flows is determined. The collector current Ic of the main IGBT 3 is in a linear region of the output characteristics E1(or an operation trace E2 illustrated in FIG. 13 which will be described below) at a time z when the collector current Ic reaches the overcurrent limiting current value Io. Then, the collector current Ic continuously increases over the overcurrent limiting current value Io. At the time z when the collector current Ic reaches the overcurrent limiting current value Io, the control IC unit 62 outputs a command to reduce the gate voltage VGE.

At a time f when the gate voltage VGE is reduced to 2.7 V, the collector current Ic is suppressed at the gate voltage VGE of 2.7 V, the increase in the collector current Ic is stopped, and the collector current Ic has the peak value Ip. Then, the gate voltage VGE is reduced to a gate voltage specific value VGEo (=2.6 V) at which the collector current Ic with the overcurrent limiting current value Io flows. In addition, for the period from the time f when the gate voltage VGE is 2.7 V to a time m when the gate voltage VGE is reduced to the gate voltage specific value VGEo, the collector current Ic is rapidly reduced from the peak value Ip to the overcurrent limiting current value Io and is constantly maintained after the time m. The overcurrent limiting current value Io of the collector current Ic is maintained (saturated). A reduction (drop) in the collector current Ic from the peak value Ip to the overcurrent limiting current value Io becomes the overshoot (ICLosc) of the collector current Ic.

At the time f that is about 6 ms after the time when the collector current Ic starts to be saturated, the overshoot (ICLosc) of the collector current Ic when the current is limited is 2.17 A (=the peak value Ip−the overcurrent limiting current value Io). The inductance L of the ignition coil 202 is 2.2 mH and the rate of change of the collector current Ic (dIc/dt) is 1 A/μs (=(the peak value Ip−the overcurrent limiting current value Io)/2.17 μs). Therefore, the secondary voltage of the ignition coil 202 is 2.2 kV due to the induced electromotive force (=L×dIc/dt) obtained by the inductance L of the ignition coil 202 and the rate of change of the current dIc/dt. As such, the secondary voltage of the ignition coil 202 is greater than 1 kV at which the spark plug 203 is discharged. Therefore, an ignition error occurs in the spark plug 203 and an operation error occurs in the engine.

In addition, the influence of a structure without the depression IGBT 20 on the operation of the igniter 800 will be described. In the experimental product No. 1 in which the depression IGBT 20 is not provided, when the collector voltage VCE of the main IGBT 3 increases, an increase in the gate voltage VGE of the main IGBT 3 by the depression IGBT 20 does not occur. Therefore, when the collector current Ic is limited, the gate voltage VGE is reduced to the gate voltage specific value VGEo at which the collector current Ic with the overcurrent limiting current value Io flows. However, until the time m when the gate voltage VGE is reduced to the gate voltage specific value VGEo, the collector current Ic of the main IGBT 3 that is greater than the overcurrent limiting current value Io flows at the rate of increase of current which is determined by the inductance of the ignition coil 202 and the voltage of a battery power supply. Therefore, at the time m when the gate voltage VGE is reduced to the gate voltage specific value VGEo, the collector current Ic rapidly reduced to the overcurrent limiting current value Io through the peak value Ip. Then, the drop in the collector current Ic increases and the overshoot of the collector current Ic increases. As a result, the secondary voltage of the ignition coil 202 is higher than a discharge voltage (1000 V), which causes an ignition error.

Figure 13:
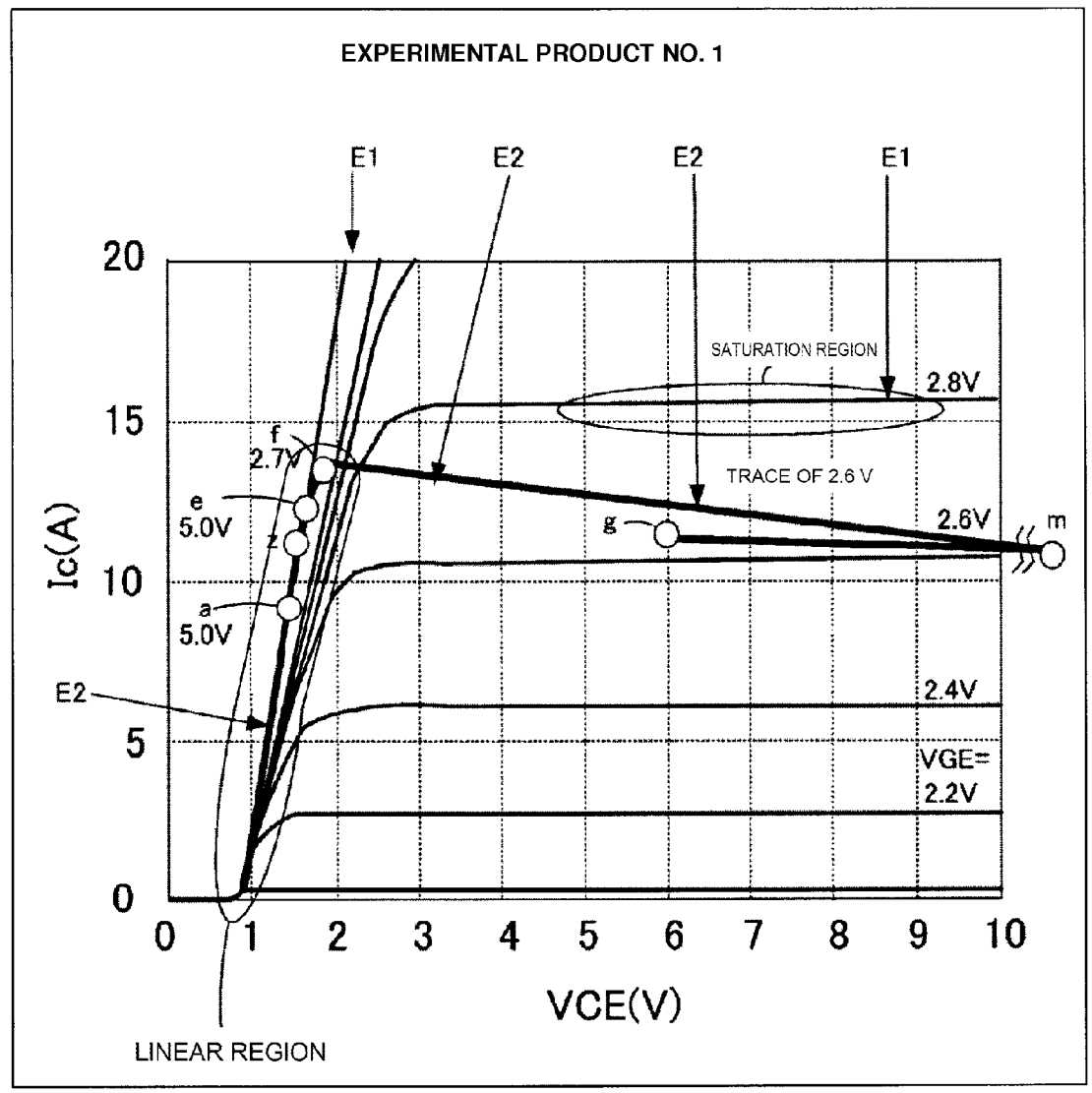
FIG. 13 is a characteristic diagram illustrating an operation trace E2 of a collector voltage VCE and a collector current Ic of a main IGBT 3 in the experimental product No. 1.

Next, a mechanism in which the collector current Ic of the main IGBT 3 overshoots will be described. FIG. 13 is a characteristic diagram illustrating the operation trace E2 of the collector voltage VCE and the collector current Ic of the main IGBT 3 in the experimental product No. 1. In FIG. 13, the operation trace E2 of the collector voltage VCE and the collector current Ic of the main IGBT 3 overlaps the output characteristics E1 of the main IGBT 3 in the experimental product No. 1. The operation trace E2 is obtained by plotting the collector current Ic and the collector voltage VCE at the same time when the current of the main IGBT 3 is limited. In FIG. 13, letters a, z, e, f, m, and g indicate the times a, z, e, f, m, and g in FIG. 12 (which holds for FIG. 14). In FIG. 13, the gate voltage VGE at the times a, e, f, and g when the main IGBT 3 is operating is also illustrated as a numerical value.

As illustrated in FIG. 13, in the operation trace E2 of the experimental product No. 1, the control IC unit 62 outputs a command to reduce the gate voltage VGE at the time z through the time a. Then, at the time e, the gate voltage VGE starts to be reduced from 5.0 V and the collector current Ic starts to be saturated. At the time f, the gate voltage VGE is reduced to 2.7 V. However, since the main IGBT 3 stays in the linear region until the time f, the collector current Ic continues to increase. At the time f, the collector current Ic has the peak value Ip. Then, the gate voltage VGE is reduced to the gate voltage specific value VGEo (=2.6 V) at which the collector current Ic with the overcurrent limiting current value Io flows by the output characteristics E1. Therefore, the collector current Ic is reduced. Then, at the time m when the gate voltage VGE reaches the gate voltage specific value VGEo (=2.6 V), the collector current Ic reaches the overcurrent limiting current value Io and is constantly maintained (saturated). The gate voltage VGE is 5.0 V for the period from the time a to the time e, is reduced at the time e, and is 2.7 V at the time f. Then, at the time m, the gate voltage VGE is reduced to 2.6 V and is constantly maintained (saturated).

As such, according to the operation trace E2 of the experimental product No. 1, in the experimental product No. 1, the main IGBT 3 is in the linear region at the time z when the current starts to be limited and the collector current Ic continues to increase even for the period from the time z to the time e. Then, the gate voltage VGE of the main IGBT 3 is reduced by a signal from the control IC unit 62 and the collector current Ic stops increasing first at the time f when the gate voltage VGE is reduced to 2.7 V. Then, while the gate voltage VGE is being reduced to 2.6 V which is the gate voltage specific value VGEo at which the collector current Ic with the overcurrent limiting current value Io flows, the collector current Ic is greatly reduced to the overcurrent limiting current value Io. That is, the collector current Ic has the peak value Ip when the gate voltage VGE is 2.7 V and is reduced from the peak value Ip to the overcurrent limiting current value Io for the period for which the gate voltage VGE is reduced from 2.7 V to 2.6 V. The difference (=the peak value Ip−the overcurrent limiting current value Io) is the overshoot (ICLosc) of the collector current Ic and is large.

The sense voltage Vsns instructs a reduction in the gate voltage VGE. When the sense voltage Vsns reaches a sense determination voltage (saturation sense voltage Vsnso) for determining an overcurrent level, a signal indicating that the sense voltage Vsns had reached the sense determination voltage is processed by the control IC unit 52 and a command to reduce the gate voltage VGE is issued from the GATE terminal. The gate voltage VGE starts to be reduced on the basis of the instruction after a predetermined period of time has elapsed from the instruction and reaches the gate voltage specific value VGEo at which the collector current Ic with the overcurrent limiting current value Io flows. The gate voltage specific value VGEo at which the collector current Ic with the overcurrent limiting current value Io flows is determined by the saturation sense voltage Vsnso which is the saturation value of the sense voltage Vsns.

Figure 14:
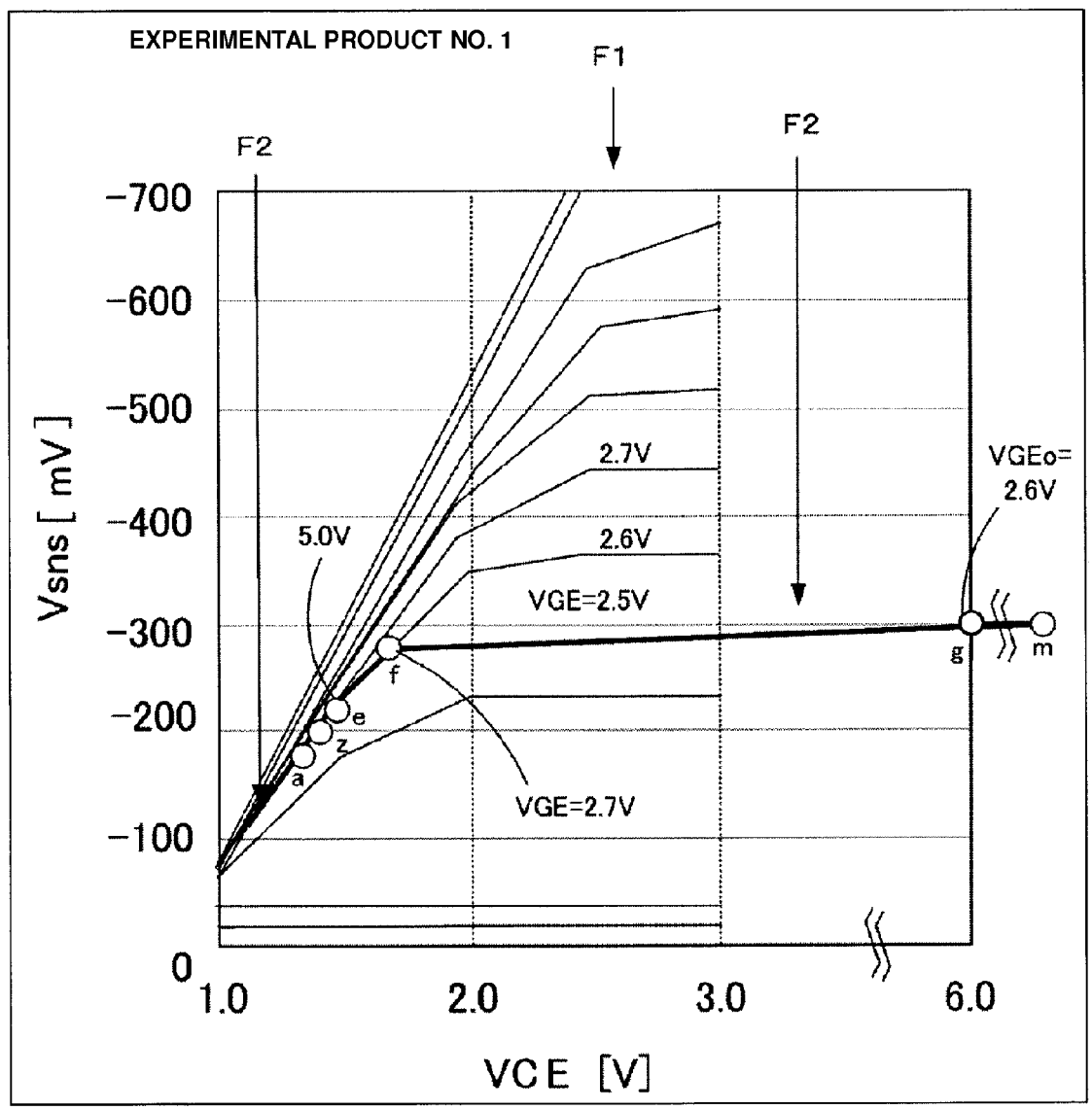
FIG. 14 is a characteristic diagram illustrating an operation trace F2 of a collector voltage VCE and a sense voltage Vsns of a sense IGBT 4 in the experimental product No. 1.

FIG. 14 is a characteristic diagram illustrating an operation trace F2 of the collector voltage VCE and the sense voltage Vsns of the sense IGBT 4 of the experimental product No. 1. In FIG. 14, the operation trace F2 of the collector voltage VCE and the sense voltage Vsns of the sense IGBT 4 overlaps the output characteristics F1 of the sense IGBT 4 of the experimental product No. 1. The sense voltage Vsns is the product of the sense resistance Rsns and the sense current Isns. In FIG. 14, the gate voltages VGE at the times e, f, and g when the sense IGBT 4 is operating are also illustrated as numerical values. At the time e, the gate voltage VGE is reduced from 5.0 V and the rate of increase of the collector current Ic of the sense IGBT 4 is reduced. At the time f, the gate voltage VGE is 2.7 V and the collector current Ic of the main IGBT 3 has the peak value Ip. At the time f, the sense voltage Vsns is not saturated, but is increasing, that is, is in the linear region. As such, at the time f when the collector current Ic of the main IGBT 3 has the peak value Ip, the sense voltage Vsns stays in the linear region in which it increases and is not saturated and the gate voltage VGE is 2.7 V. At the time g, the gate voltage VGE is 2.6 V and the sense voltage Vsns increases and is saturated at the saturation sense voltage Vsnso. The collector current Ic of the main IGBT 3 is significantly reduced and is stabilized at the overcurrent limiting current value Io. Then, the gate voltage VGE is constantly maintained at 2.6 V which is the gate voltage specific value VGEo.

The reason why, when the gate voltage VGE is reduced from 2.7 V to 2.6 V, the collector current Ic is rapidly reduced only by 2.17 A and is then saturated is as follows. When an error occurs, the control IC unit 62 starts to reduce the gate voltage VGE of the main IGBT 3 from 5 V such that the main IGBT 3 is not equal to or greater than a given value (overcurrent limiting current value Io). Specifically, when the sense voltage Vsns (=the sense resistance Rsns×the sense current Isns) which is determined from the sense resistance Rsns has a predetermined value (Vsns1), the control IC unit 62 determines that the collector current Ic of the main IGBT 3 has reached the overcurrent limiting current value Io (<the peak value Ip) and starts to reduce the gate voltage VGE of the main IGBT 3.

In addition, the control IC unit 62 continuously detects the sense voltage Vsns. When the sense voltage Vsns has a predetermined value Vsns2 (>Vsns1), the control IC unit 62 determines that the collector current Ic of the main IGBT 3 has reached the overcurrent limiting current value Io, stops reducing the gate voltage VGE of the main IGBT 3, and stores the value at that time.

In this case, the current (sense current Isns) of the sense IGBT 4 which is arranged close to the main IGBT 3 on the same chip needs to be saturated or needs to at least start to be saturated in order for the collector current Ic of the main IGBT 3 to be saturated at the overcurrent limiting current value Io. Otherwise, since the sense current Isns is in the linear region when the collector voltage VCE increases, the sense current Isns also increases. Therefore, the control IC unit 62 further reduces the gate voltage VGE.

In particular, when the sense IGBT 4 is sufficiently distant from the main IGBT 3, the density of the current which flows through the sense IGBT 4 is less than the density of the current which flows through the main IGBT 3 even though the IGBTs have the same basic structure. Therefore, even when the collector current Ic of the main IGBT 3 has been saturated, the sense current Isns has not been saturated yet. Therefore, as described above, when the collector voltage VCE of the main IGBT 3 increases, the sense current Isns also increases. The control IC unit 62 further reduces the gate voltage VGE.

In particular, in FIG. 12, when the gate voltage VGE is 2.7 V and the collector current Ic starts to be reduced for the above-mentioned reason, the sense current Isns which needs to at least start to be saturated is not saturated. Therefore, when the collector voltage VCE starts to increase, the sense current Isns increases with the increase in the collector voltage VCE. Then, the control IC unit 62 further reduces the gate voltage VGE. A reduction in the gate voltage VGE for the period from the time f to the time m is −0.1 V (2.7

V→2.6 V). The collector current Ic of the main IGBT 3 is reduced by 2.17 A with the reduction in the gate voltage VGE.

The inductance of the ignition coil 202 which is connected in series to the main IGBT 3 is very large. Therefore, the collector voltage VCE is equal to or greater than 14 V (FIG. 12) in proportion to the rate of decrease of current when the collector current Ic of the main IGBT 3 is reduced by 2.17 A and an ignition error occurs in the spark plug 203 which is connected to the secondary side of the ignition coil 202.

Figure 3:
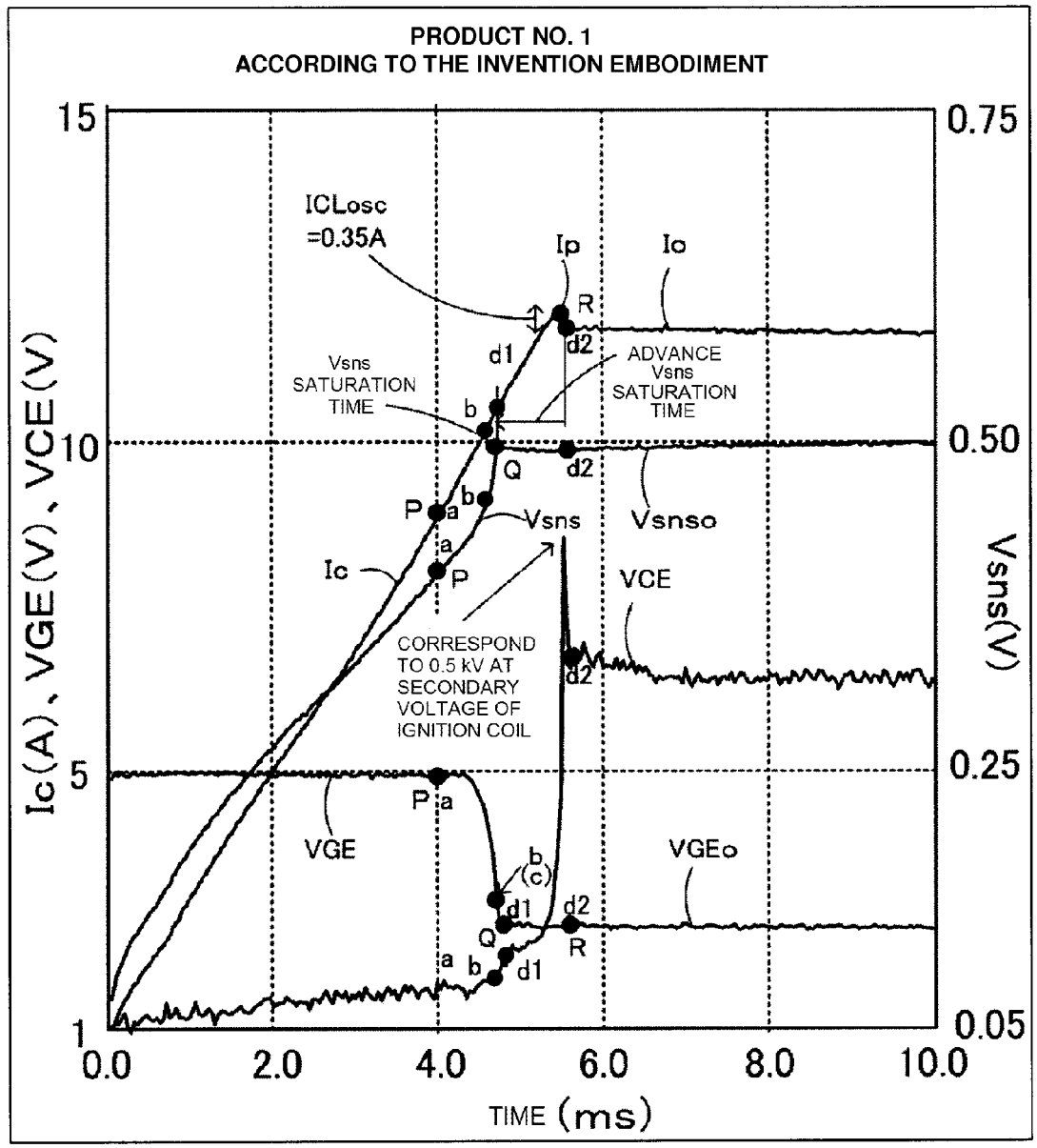
FIG. 3 is a characteristic diagram illustrating an operation waveform when the current of a product No. 1 according to embodiments of the invention is limited.

Next, the operation of the igniter 200 according to Embodiment 1 of the invention will be described. FIG. 3 is a characteristic diagram illustrating operation waveforms when the current of the product No. 1 according to embodiments of the invention is limited. FIG. 3 illustrates the operation waveforms of the collector current Ic of the main IGBT 3, the sense voltage Vsns which is generated by the sense resistance Rsns, the collector voltage VCE of the main IGBT 3, and the gate voltage VGE of the main IGBT 3 when the current of the product No. 1 according to embodiments of the invention is limited. In FIG. 3, arbitrary times while the product No. 1 according to embodiments of the invention is operating are sequentially represented by letters and numerals a (or P), b, c, d1 (or Q), and d2 (or R) over time (which holds for FIGS. 4 and 5). ICLosc (=0.35 A) is the overshoot of the collector current Ic of the main IGBT 3 when the current is limited. Although the operation waveforms of the product No. 2 according to embodiments of the invention are not illustrated, the product No. 2 according to embodiments of the invention has similar operation waveforms to the product No. 1 according to embodiments of the invention.

As illustrated in FIG. 3, in the product No. 1 according to embodiments of the invention, the overshoot (ICLosc) of the collector current Ic is 0.35 A and the secondary voltage (overshoot voltage) of the ignition coil 202 is 0.5 kV. As such, when the sense IGBT 4 is arranged at a position that is 150 μm away from the main IGBT 3, it is possible to significantly reduce the overshoot (ICLosc) of the collector current Ic and the secondary voltage of the ignition coil 202, as compared to the experimental products.

The operation of the igniter 200 according to Embodiment 1 of the invention will be described in detail with reference to FIG. 3. When a certain error (for example, overcurrent) occurs, the control IC unit 2 issues a command to reduce the gate voltage VGE on the basis of the sense voltage Vsns at the time P when the collector current Ic of the main IGBT 3 reaches a predetermined current (a current which is determined to be an error) that is less than the overcurrent limiting current value Io and is greater than a normal operation current. The gate voltage VGE is reduced to the gate voltage specific value VGEo at which the collector current Ic with the overcurrent limiting current value Io flows, in response to the command (time Q). In this case, the sense voltage Vsns increases to the saturation sense voltage Vsnso which determines the gate voltage specific value VGEo, is constant after the time Q, and is substantially maintained at the saturation sense voltage Vsnso (saturated). At the time Q, the collector current Ic is not in a saturation region, but is in the linear region. The collector current Ic increases to the overcurrent limiting current value Io which is suppressed by the gate voltage specific value VGEo and is constantly maintained at the overcurrent limiting current value Io (saturated). Therefore, as in the conventional product, little difference occurs in the collector current Ic when the current is limited and the overshoot (ICLosc) is more suppressed than that in the experimental product.

This shows the following. Before the collector current Ic of the main IGBT 3 is constantly maintained at the overcurrent limiting current value Io (saturated), the sense voltage Vsns is constantly maintained at the saturation sense voltage Vsnso (saturated). In addition, before the sense voltage Vsns is saturated, the control IC unit 2 issues a command to reduce the gate voltage VGE (time P) and the gate voltage VGE is reduced from 5.0 V to the gate voltage specific value VGEo (=2.6 V) at which the collector current Ic with the overcurrent limiting current value Io flows, and is constantly maintained at the gate voltage specific value VGEo. At the time Q when the gate voltage VGE is reduced to the gate voltage specific value VGEo (=2.6 V), the collector current Ic of the main IGBT 3 stays in the linear region and is not suppressed by the gate voltage specific value VGEo. Therefore, the collector current Ic continues to increase. At the time R when the collector current Ic reaches the overcurrent limiting current value Io which is suppressed by the gate voltage specific value VGEo, the collector current Ic is maintained at the overcurrent limiting current value Io (saturated). Therefore, the overshoot (ICLosc) of the collector current Ic of the main IGBT 3 is significantly reduced.

This phenomenon occurs in the product according to embodiments of the invention because a portion (hole current) of the collector current Ic of the main IGBT 3 flows to the sense IGBT 4. When the hole current flows, the amount of current which flows to the sense IGBT 4 increases and the time Q when the sense IGBT 4 reaches the saturation current (the sense current Isns corresponding to the saturation sense voltage Vsnso) is advanced. As a result, at the time Q, the gate voltage VGE is reduced to the gate voltage specific value VGEo and the collector current Ic has not reached the overcurrent limiting current value Io and is in the saturation region. Therefore, the collector current Ic continues to increase to the overcurrent limiting current value Io suppressed by the gate voltage specific value VGEo. The collector current Ic is constantly maintained in the stage (time R) in which it reaches the overcurrent limiting current value Io. Therefore, the overshoot of the collector current Ic is reduced. This effect increases as the sense IGBT 4 becomes close to the main IGBT 3 (see FIGS. 6 and 7).

Figure 4:
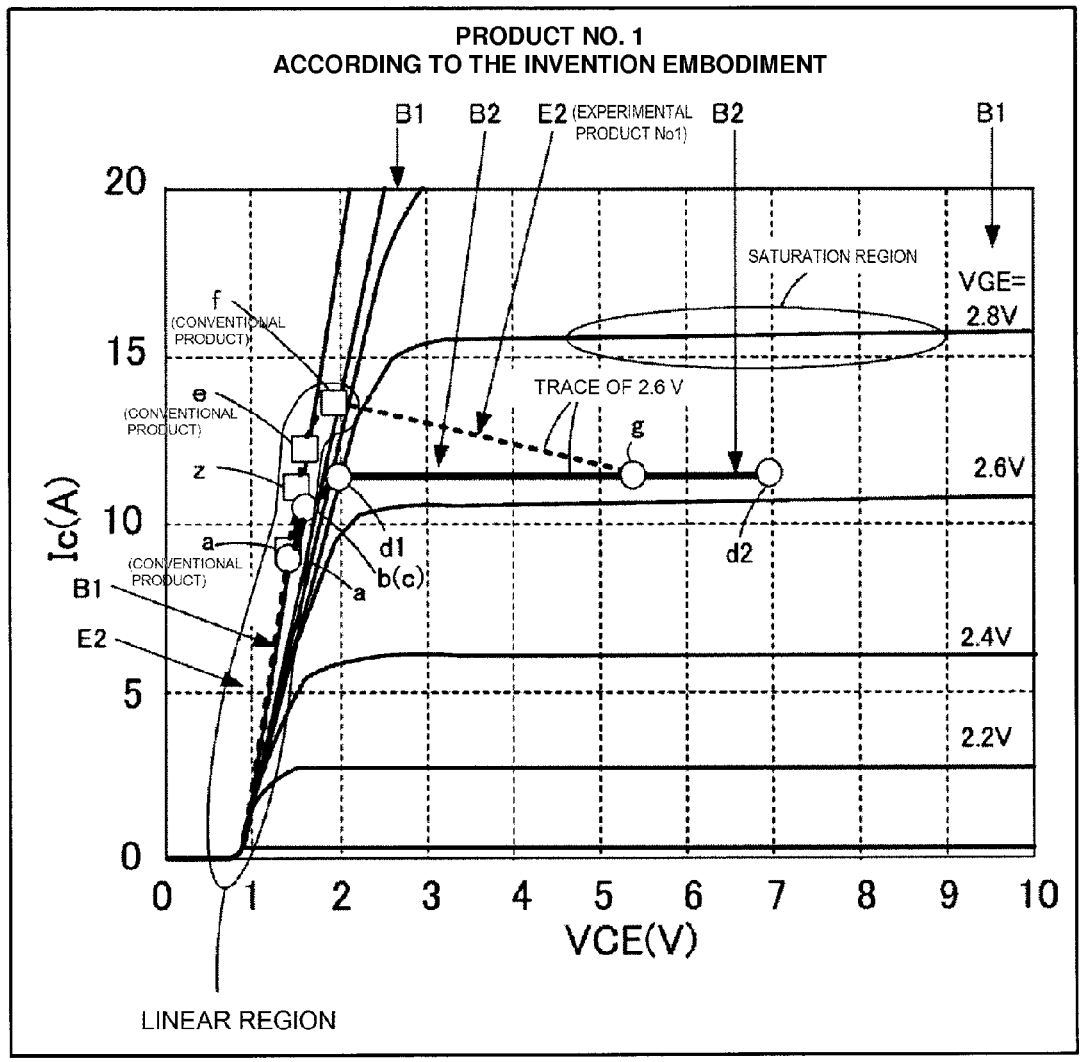
FIG. 4 is a characteristic diagram illustrating an operation trace B2 of a collector voltage VCE and a collector current Ic of the main IGBT 3 in the product No. 1 according to embodiments of the invention.

Next, the operation and effect of the product No. 1 according to embodiments of the invention will be described. FIG. 4 is a characteristic diagram illustrating an operation trace B2 of the collector voltage VCE and the collector current Ic of the main IGBT 3 in the product No. 1 according to embodiments of the invention. In FIG. 4, the output characteristics of the main IGBT 3 and the sense IGBT 4 in the product No. 1 according to embodiments of the invention are represented by B1 and C1, respectively, and the output characteristics of the main IGBT 3 and the sense IGBT 4 in the experimental product No. 1 are represented by E1 and F1, respectively. The operation traces of the collector voltage VCE and the collector current Ic of the main IGBT 3 and the sense IGBT 4 in the product according to embodiments of the invention when the current is limited are represented by B2 and C2, respectively. The operation traces of the collector voltage VCE and the collector current Ic of the main IGBT 3 and the sense IGBT 4 in the experimental product No. 1 are represented by E2 and F2, respectively.

In FIG. 4, the operation trace B2 of the collector voltage VCE and the collector current Ic of the main IGBT 3 when the current is limited overlaps the output characteristics B1 of the main IGBT 3 in the product No. 1 according to embodiments of the invention. In addition, in FIG. 4, the operation trace E2 of the collector voltage VCE and the collector current Ic of the sense IGBT 4 in the experimental product No. 1 (see FIG. 13) is represented by a dotted line for reference. The gate voltage VGE is also represented by a numerical value.

In the product No. 1 according to embodiments of the invention illustrated in FIG. 4, as described above, the distance L between the main IGBT 3 and the sense IGBT 4 is 150 μm. In contrast, in the experimental product No. 1 illustrated in FIG. 13, as described above, the distance L between the main IGBT 3 and the sense IGBT 4 is 800 μm. As such, the distance L between the main IGBT 3 and the sense IGBT 4 is different in the product No. 1 according to embodiments of the invention and the experimental product No. 1, but the output characteristics B1 and E1 of the main IGBT 3 are substantially the same in the product No. 1 according to embodiments of the invention and the experimental product No. 1.

Here, the reason why there is a slight deviation between the output characteristics B1 of the product No. 1 according to embodiments of the invention and the operation trace B2 of the collector voltage VCE and the collector current Ic when the current is limited in the linear region will be described. The output characteristics B1 of the product No. 1 according to embodiments of the invention are measured by probing only the main IGBT 3 in a semiconductor chip state. In contrast, the operation trace B2 of the collector voltage VCE and the collector current Ic when the current is limited is measured after a semiconductor chip of the main IGBT 3 and a semiconductor chip of the control IC unit 2 are packed into a combination mold package. That is, contact resistance, parasitic capacitance, and parasitic inductance caused by, for example, a measurement system and a package are different in the output characteristics and the operation trace of the collector voltage VCE and the collector current Ic when the current is limited. When these conditions are strictly matched, the output characteristics are sufficiently close to the operation trace of the collector voltage VCE and the collector current Ic when the current is limited. In addition, when the operation trace of the collector voltage VCE and the collector current Ic when the current is limited is measured, the gate voltage VGE is also measured at the same time.

In the operation trace B2 of the product No. 1 according to embodiments of the invention, the gate voltage VGE is 5.0 V at a time a (when the gate voltage VGE starts to be reduced), is 2.7 V for a period from a time b to a time c, and is 2.6 V (=the gate voltage specific value VGEo) at times d1 and d2. At the time c, the collector current Ic has a peak value Ip that is less than that in the experimental product No. 1.

In contrast, in the operation trace F2 of the experimental product No. 1 which is represented by a dotted line, the gate voltage VGE is 5.0 V for a period from the time a to a time e, is 2.7 V at a time f, and is 2.6 V (=the gate voltage specific value VGEo) at a time g. In addition, the gate voltage VGE starts to be reduced at the time e and the collector current Ic has the peak value Ip at the time f.

In the operation trace E2 of the experimental product No. 1, at the time f, the gate voltage VGE is 2.7 V and the collector current Ic is suppressed by the output characteristics E1 and has the peak value Ip. Then, the gate voltage VGE is reduced to the gate voltage specific value VGEo (=2.6 V) and the collector current Ic is rapidly reduced to the overcurrent limiting current value Io and is constantly maintained (saturated). That is, the collector current Ic is suppressed at 2.7 V at the time f immediately before a time m when the gate voltage VGE reaches the gate voltage specific value VGEo (=2.6 V). The suppressed collector current Ic has the peak value Ip. Then, the gate voltage VGE is reduced to the gate voltage specific value VGEo (=2.6 V) and the collector current Ic is rapidly reduced from the peak value Ip to the overcurrent limiting current value Io and is constantly maintained (saturated). In this case, the sense voltage Vsns which determines the gate voltage specific value VGEo becomes the saturation sense voltage Vsnso and is constantly maintained (saturated). Therefore, the collector current Ic is rapidly reduced from the peak value Ip to the overcurrent limiting current value Io. That is, a large overshoot (ICLosc) occurs.

In contrast, in the operation trace B2 of the product No. 1 according to embodiments of the invention, when overcurrent flows and the collector current Ic reaches the overcurrent limiting current value Io, a command to reduce the gate voltage VGE is issued on the basis of the sense voltage Vsns corresponding to the collector current Ic (time a). As can be seen from FIG. 3, the gate voltage VGE is reduced to the gate voltage specific value VGEo (=2.6 V) at which the collector current Ic with the overcurrent limiting current value Io flows and is constantly maintained (saturated), in response to the command (time d1). However, at the time d1 when the gate voltage VGE is reduced to the gate voltage specific value VGEo, the collector current Ic is in the linear region. Even when the collector voltage VCE starts to increase, the collector current Ic continues to increase over the overcurrent limiting current value Io. At the time d2 when the collector current Ic reaches the overcurrent limiting current value Io which flows at the gate voltage specific value VGEo (=2.6 V), the collector current Ic is constantly maintained (saturated; the peak value Ip≈the overcurrent limiting current value Io) by the output characteristics B1. A small oscillation occurs at the time d2 when the collector current Ic is constant. There is little difference in the collector current Ic and the overshoot (ICLosc) is suppressed to 0.35 A. In addition, at the time d1 when the gate voltage VGE is reduced and is constantly maintained, the sense voltage Vsns which determines the gate voltage specific value VGEo (=2.6 V) increases to the saturation sense voltage Vsnso and is constantly maintained (saturated).

Figure 5:
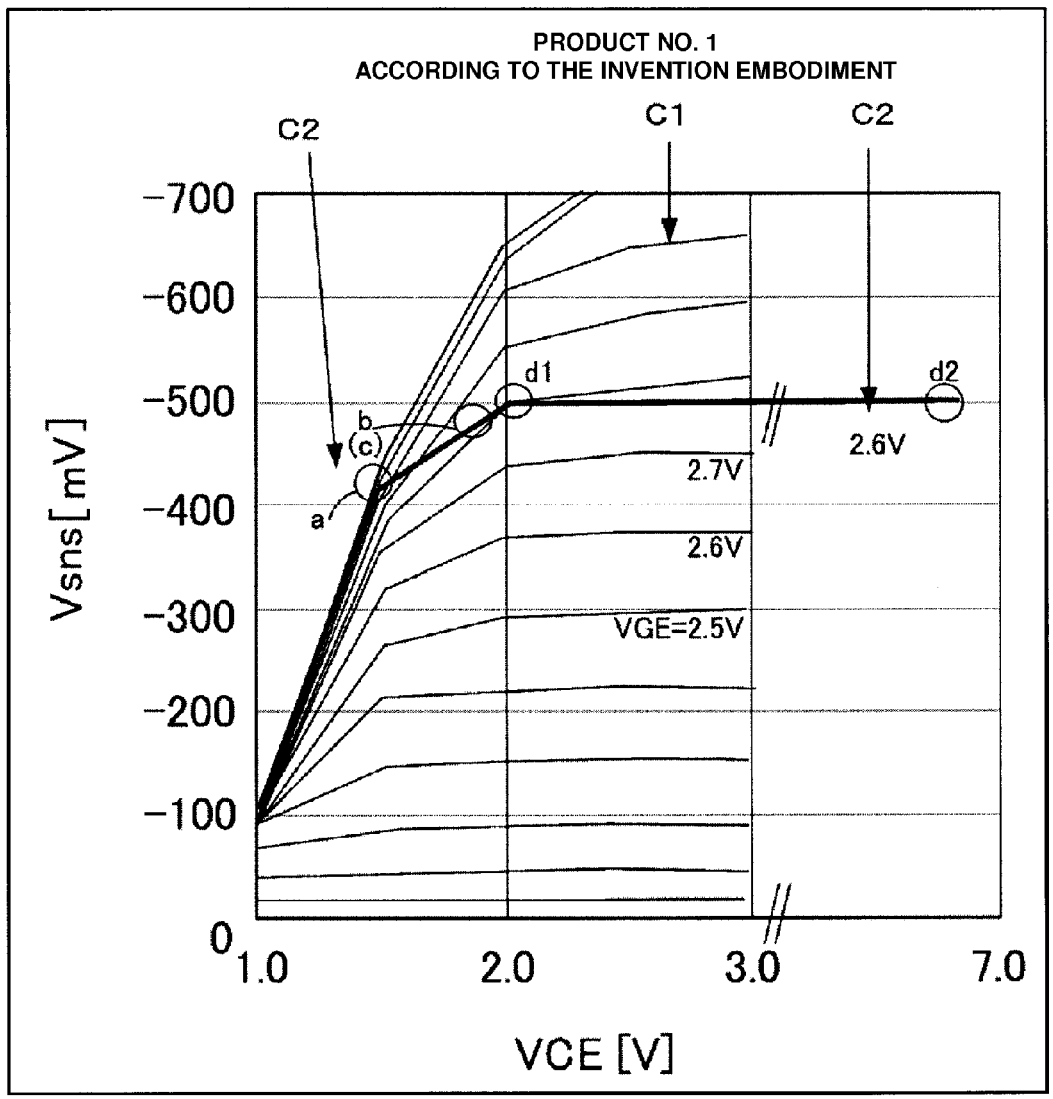
FIG. 5 is a characteristic diagram illustrating an operation trace C2 of a collector voltage VCE and a sense voltage Vsns of the sense IGBT 4 in the product No. 1 according to embodiments of the invention.

FIG. 5 is a characteristic diagram illustrating an operation trace C2 of the collector voltage VCE and the sense voltage Vsns of the sense IGBT 4 in the product No. 1 according to embodiments of the invention. In FIG. 5, the operation trace C2 of the collector voltage VCE and the sense voltage Vsns of the sense IGBT 4 overlaps the output characteristics C1 of the sense IGBT 4 in the product No. 1 according to embodiments of the invention. Times a to d1 and d2 in the operation trace C2 illustrated in FIG. 5 are the same as the times a to d1 and d2 in the operation trace B2 illustrated in FIG. 4. At the time d2 when the collector current Ic is constant (the time when the collector current Ic of the main IGBT 3 has the peak value Ip), the sense voltage Vsns is in the saturation region (saturation sense voltage Vsnso) and the gate voltage VGE is maintained at the gate voltage specific value VGEo (=2.6 V).

As described above, in FIG. 12, in the experimental product No. 1, the collector current Ic increases over the overcurrent limiting current value Io and the sense voltage Vsns also increases until the time m when the collector current Ic reaches the overcurrent limiting current value Io. Therefore, the collector current Ic of the main IGBT 3 that is significantly greater than the overcurrent limiting current value Io flows and is then reduced to the overcurrent limiting current value Io. The collector current Ic is significantly reduced from the peak value Ip and is stabilized at the overcurrent limiting current value Io. That is, a large overshoot occurs in the collector current Ic.

In contrast, as illustrated in FIGS. 4 and 5, as can be seen from the output characteristics B1 of the main IGBT 3, the output characteristics C1 of the sense IGBT 4, and the operation traces B2 and C2 thereof in the product No. 1 according to embodiments of the invention, in the product No. 1 according to embodiments of the invention, after the gate voltage VGE is reduced to the gate voltage specific value VGEo at which the collector current Ic with the overcurrent limiting current value Io flows and is constantly maintained (saturated) by the output characteristics B1, that is, immediately after the sense voltage Vsns is saturated at the saturation sense voltage Vsnso, the main IGBT 3 is in the linear region and is not saturated. Therefore, immediately after the sense voltage Vsns is saturated at the saturation sense voltage Vsnso, the collector current Ic continues to increase and is constantly maintained (saturated) at the time when it reaches the overcurrent limiting current value Io which flows at the gate voltage specific value VGEo. Therefore, the collector current Ic increases and is smoothly transferred to the constant overcurrent limiting current value Io and a reduction in the collector current Ic of the main IGBT 3 is very small. As a result, the overshoot (ICLosc) of the collector current Ic is significantly reduced.

The reason why the overshoot (ICLosc) is suppressed in the igniter 200 which is the product according to the invention is as follows. When the sense IGBT 4 is significantly close to the main IGBT 3 and the collector current Ic of the main IGBT 3 is saturated, the sense current Isns of the sense IGBT 4 is also saturated. Therefore, when the control IC unit 2 starts to reduce the gate voltage VGE at Vsns1 and stops reducing the gate voltage VGE at Vsns2 on the basis of the determination result indicating that the collector current Ic has reached the saturation value (overcurrent limiting current value Io), the sense current Isns is saturated or at least starts to be saturated. Then, the collector current Ic of the main IGBT 3 is saturated and the collector voltage VCE starts to increase. However, since the sense current Isns has been in the saturated region, there is little increase in the sense current Isns even when the collector voltage VCE increases. In addition, there is little increase in the sense voltage Vsns. Therefore, the control IC unit 2 does not need to further reduce the gate voltage VGE or slightly reduces the gate voltage VGE when the gate voltage VGE needs to be reduced. The amount of current (ICLosc) required to reduce the collector current Ic of the main IGBT 3 to the saturation value (overcurrent limiting current value Io) and the rate of decrease of current are very small and an increase in the collector voltage VCE due to the induced electromotive force of the ignition coil 202 is also suppressed. The secondary voltage of the ignition coil 202 is equal to or less than an ignition threshold value of the spark plug 203.

Figure 6:
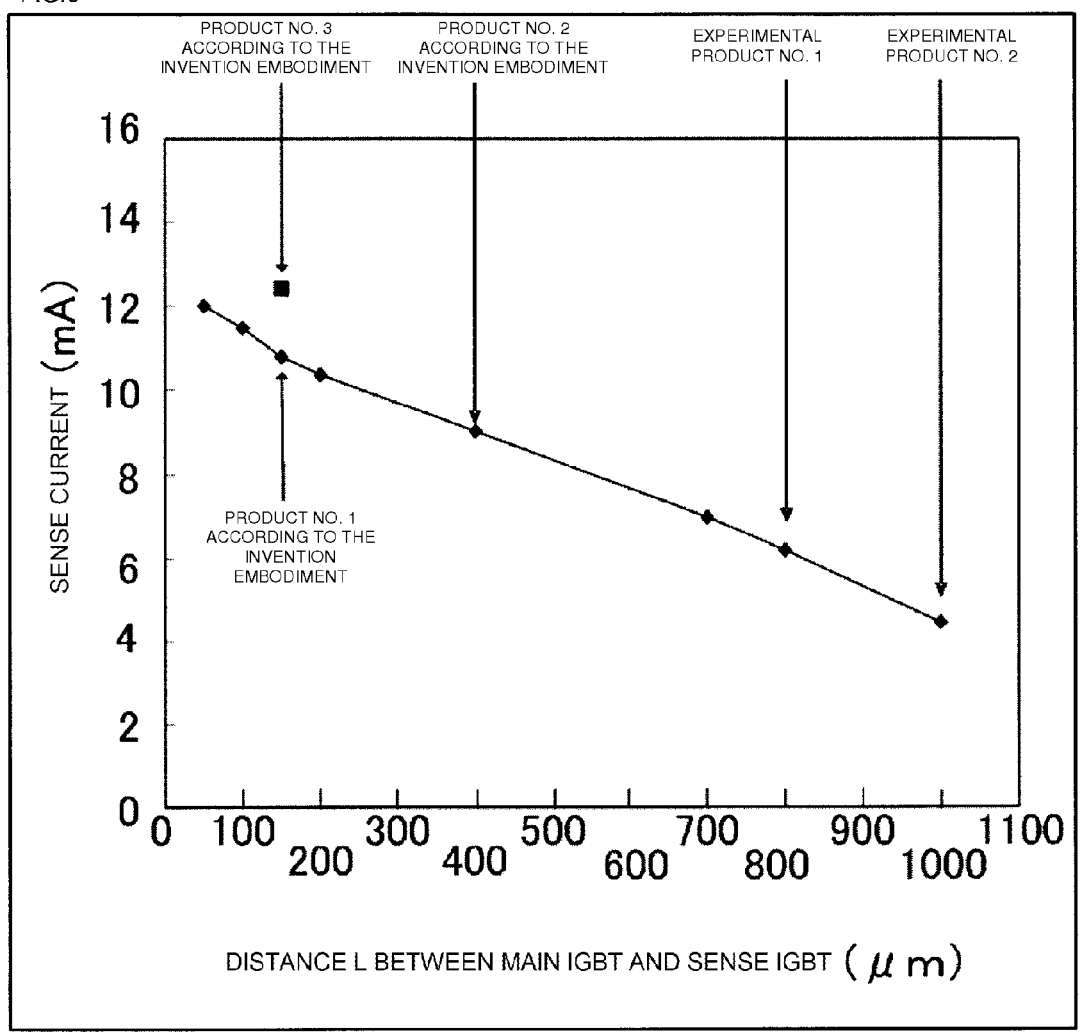
FIG. 6 is a characteristic diagram illustrating the relationship between a distance L between the main IGBT 3 and the sense IGBT 4 and a sense current Isns.

Next, the distance L between the main IGBT 3 and the sense IGBT 4 will be described. FIG. 6 is a characteristic diagram illustrating the relationship between a main IGBT 3-sense IGBT 4 distance (the distance between the main IGBT 3 and the sense IGBT 4) L and the sense current Isns. A plurality of samples in which the distance L between the main IGBT 3 and the sense IGBT 4 was in the range of 50 μm to 1000 μm were manufactured and the sense current Isns of each sample was measured. FIG. 6 illustrates the measurement results. As can be seen from the results illustrated in FIG. 6, as the distance L between the sense IGBT 4 and the main IGBT 3 decreases, the sense current Isns increases.

The reason is as follows. The main IGBT 3 and the sense IGBT 4 share the collector 3a and are arranged in parallel. When the distance L between the main IGBT 3 and the sense IGBT 4 is small, the current of the main IGBT 3 flows to the sense IGBT 4 and the sense current Isns increases. As a result, as described above, the overshoot of the main IGBT 3 is suppressed.

Figure 7:
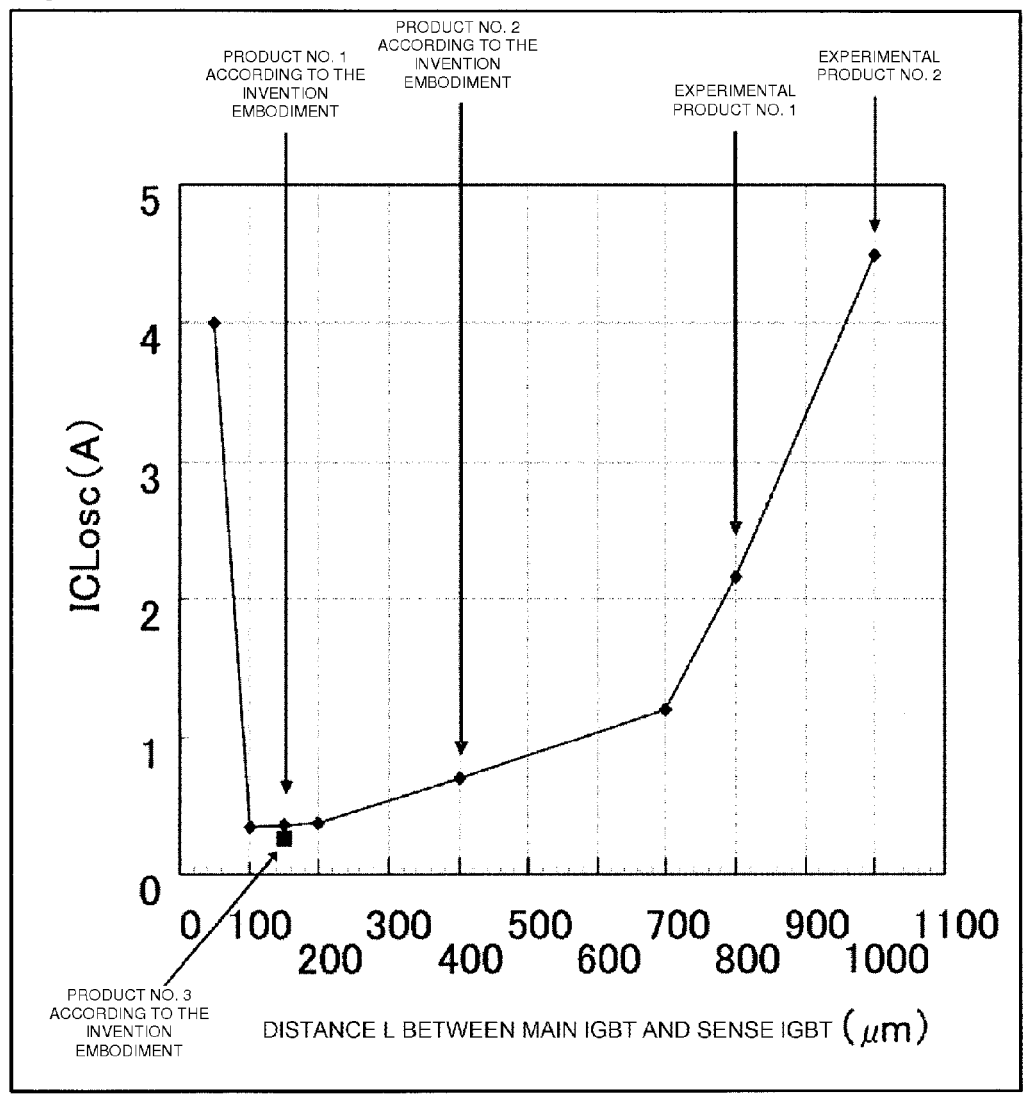
FIG. 7 is a characteristic diagram illustrating relationship between ICLosc and the distance L between the main IGBT 3 and the sense IGBT 4.

FIG. 7 is a characteristic diagram illustrating the relationship between ICLosc and the distance between the main IGBT 3 and the sense IGBT 4. A plurality of samples in which the distance L between the main IGBT 3 and the sense IGBT 4 was in the range of 50 μm to 1000 μm were manufactured and the overshoot (ICLosc) of each sample was measured. FIG. 7 illustrates the measurement results. As can be seen from the results illustrated in FIG. 7, as the distance L between the main IGBT 3 and the sense IGBT 4 is reduced, the overshoot (ICLosc) is reduced. The reason is that, as described above, when the distance L between the main IGBT 3 and the sense IGBT 4 is reduced, the saturation of the sense voltage Vsns is quickened and the main IGBT 3 is saturated after the sense voltage Vsns is saturated. Since the sense voltage Vsns is saturated before the main IGBT 3, the collector current Ic increases to the overcurrent limiting current value Io which is suppressed the low gate voltage specific value VGEo of the main IGBT 3 and is then constantly maintained (saturated). As a result, the overshoot of the collector current Ic is very small. In the product No. 3 according to embodiments of the invention, the sense IGBT 4 is arranged close to three sides of the main IGBT 3. Therefore, the sense current Isns is further reduced, as compared to the product No. 1 according to embodiments of the invention in which the sense IGBT is arranged close to two sides of the main IGBT 3. Therefore, it is possible to further reduce the overshoot.

As can be seen from the results illustrated in FIG. 7, when the distance L between the main IGBT 3 and the sense IGBT 4 is equal to or less than 700 μm, the overshoot is less than that in the experimental product No. 1. In addition, when the distance L between the main IGBT 3 and the sense IGBT 4 is equal to or less than 200 μm, the overshoot is significantly reduced. As a result, it is possible to prevent an ignition error in the spark plug 203.

However, when the distance L between the main IGBT 3 and the sense IGBT 4 is less than 100 μm, the overshoot (ICLosc) increases significantly and the collector voltage VCE of the main IGBT 3 oscillates. It is presumed that this is because the distance L between the main IGBT 3 and the sense IGBT 4 is too short, a very large amount of current flows from the main IGBT 3 to the sense IGBT 4, and the gain of the sense IGBT 4 (=the collector current/the gate voltage) is apparently high.

Therefore, the distance L between the main IGBT 3 and the sense IGBT 4 may be equal to or greater than 100 μm and equal to or less than 700 μm. Preferably, the distance L between the main IGBT 3 and the sense IGBT 4 may be equal to or greater than 100 μm and equal to or less than 200 μm. The control IC unit 2 can be controlled to prevent the oscillation of the collector voltage VCE due to a very short distance L between the main IGBT 3 and the sense IGBT 4.

<Embodiment 2>

Figure 8:
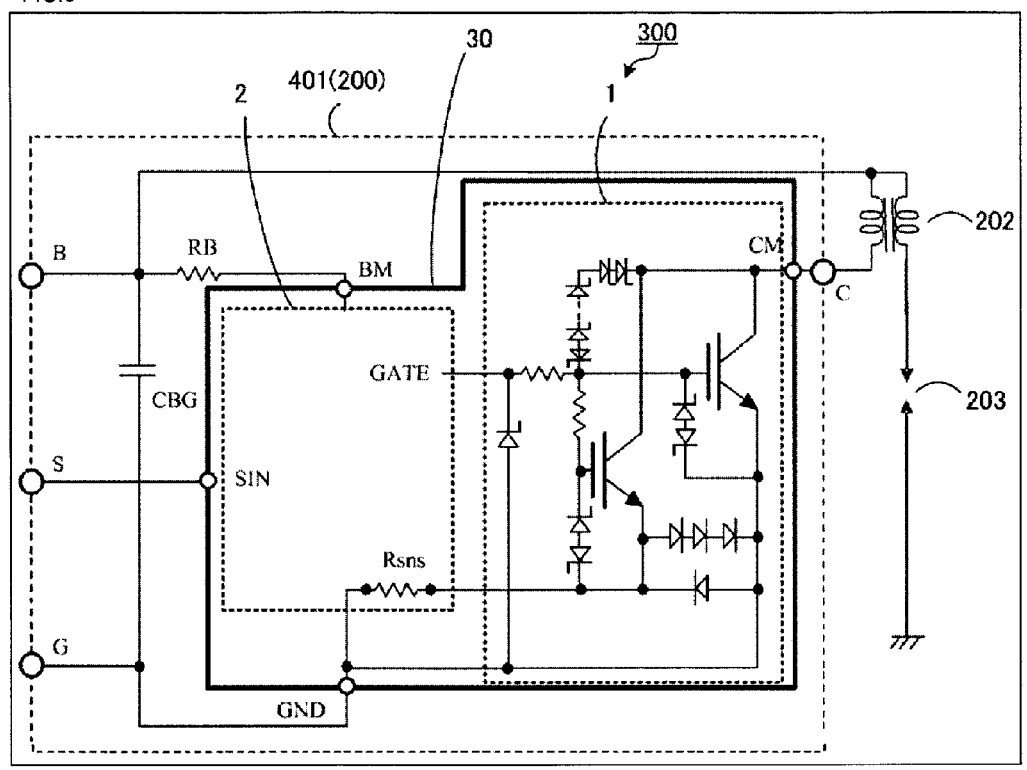
FIG. 8 is a diagram illustrating the structure of a main portion of an internal combustion engine ignition apparatus 300 according to a second embodiment of the invention and a circuit diagram illustrating the circuit structure of a main portion of a one-chip igniter 401 that is provided in the internal combustion engine ignition apparatus 300.
Figure 9:
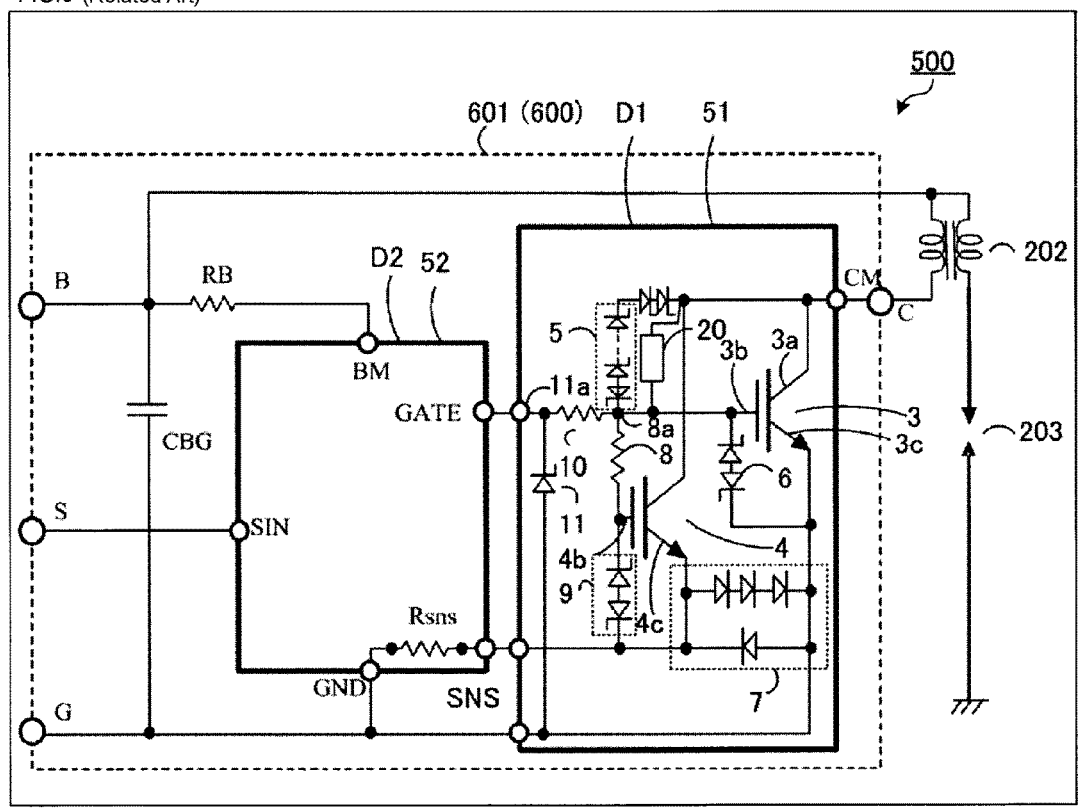
FIG. 9 is a circuit diagram illustrating the circuit structure of a main portion of an internal combustion engine ignition apparatus 500 according to the related art.

Next, the structure of an internal combustion engine ignition apparatus according to Embodiment 2 will be described. FIG. 8 is a circuit diagram illustrating the structure of a main portion of an internal combustion engine ignition apparatus 300 according to Embodiment 2 of the invention. FIG. 8 also illustrates a circuit diagram illustrating a main portion of a one-chip igniter 401 provided in the internal combustion engine ignition apparatus 300.

The internal combustion engine ignition apparatus 300 according to Embodiment 2 differs from the internal combustion engine ignition apparatus 100 according to Embodiment 1 in that the IGBT unit 1 and the control IC unit 2 are formed on the same semiconductor substrate 30 (one semiconductor chip). In this case, the same effect as that in the multi-chip igniter 201 illustrated in FIG. 1 is obtained by the one-chip igniter 401 illustrated in FIG. 8.

The one-chip igniter 401 illustrated in FIG. 8 is provided in the internal combustion engine ignition apparatus 300. In the internal combustion engine ignition apparatus 300, it is possible to obtain the same effect as that in the internal combustion engine ignition apparatus 100 according to Embodiment 1.

As described above, according to embodiments of the invention, even though the depression IGBT is not provided, it is possible to prevent the overshoot of the collector current of the main IGBT when the current is limited. In addition, according to embodiments of the invention, since the depression IGBT is not provided, it is possible to reduce the size of the igniter and to suppress the overshoot of the collector current of the main IGBT. It is possible to provide an internal combustion engine ignition apparatus which has a small size and prevents an ignition error.

Various modifications and changes in the invention and the illustrated embodiments can be made. In each of the above-described embodiments, for example, the dimensions or surface concentration of each component are set to various values depending on the required specifications. In each of the above-described embodiments, the IGBT with the planar gate structure has been described as an example. However, the invention is not limited thereto, but can also be applied to an IGBT with a trench gate structure. In addition, in embodiments of the invention, the conductivity types may be reversed. In this case, the same effect as described above is obtained.

INDUSTRIAL APPLICABILITY

As described above, the igniter, the igniter control method, and the internal combustion engine ignition apparatus according to embodiments of the invention are useful for power semiconductor devices which are used in, for example, igniters of vehicles.

REFERENCE SIGNS AND NUMERALS

1 IGBT UNIT
2 CONTROL IC UNIT
3 MAIN IGBT
3a COLLECTOR
3b, 4b GATE
3c, 4c EMITTER
4 SENSE IGBT
4e p$^-$ EXTRACTION REGION
5 G-C ZENER DIODE
6 G-E ZENER DIODE
7 DIODE
8, 10 RESISTOR
8a, 11a CONNECTION POINT
9 SENSE G-E ZENER DIODE
11 ZENER DIODE
40 p$^-$ COLLECTOR LAYER
41 n$^+$ BUFFER LAYER
42 n$^-$ DRIFT LAYER
43 p BASE LAYER
44 n$^-$ EMITTER LAYER
45 GATE INSULATING FILM
46 GATE ELECTRODE
47 EMITTER ELECTRODE
48 COLLECTOR ELECTRODE
49 INTERLAYER INSULATING FILM
100, 300 INTERNAL COMBUSTION ENGINE IGNITION APPARATUS
200 IGNITER
201 MULTI-CHIP IGNITER
202 IGNITION COIL
203 SPARK PLUG
401 ONE-CHIP IGNITER
A1, A2 SEMICONDUCTOR CHIP
BM, B BATTERY TERMINAL
B1, C1 OUTPUT CHARACTERISTICS
B2, C2 OPERATION TRACE
C, CM COLLECTOR TERMINAL
CBG CAPACITOR
G, GND GROUND TERMINAL
Ic COLLECTOR CURRENT
Io OVERCURRENT LIMITING CURRENT VALUE OF COLLECTOR CURRENT
Ip PEAK VALUE OF COLLECTOR CURRENT
Isns SENSE CURRENT
RB BATTERY RESISTOR
Rsns SENSE RESISTOR
SIN, S CONTROL TERMINAL
SNS SENSE TERMINAL
VCE COLLECTOR VOLTAGE
VGE GATE VOLTAGE
VGEo GATE VOLTAGE SPECIFIC VALUE AT WHICH COLLECTOR CURRENT WITH OVERCURRENT LIMITING CURRENT VALUE FLOWS
Vsns SENSE VOLTAGE
Vsnso SATURATION SENSE VOLTAGE Although a few embodiments have been shown and described, it would be appreciated by those skilled in the art that changes may be made in these embodiments without departing from the principles and spirit of the invention, the scope of which is defined in the claims and their equivalents.

What is claimed is:

1. An igniter comprising:
a main insulated gate transistor including
a first semiconductor layer of a first conductivity type,
a second semiconductor layer of a second conductivity type that is selectively provided in a surface layer of a first main surface of the first semiconductor layer,
a third semiconductor layer of the first conductivity type that is selectively provided in the second semiconductor layer,
a first gate electrode that is provided on a surface of a portion of the second semiconductor layer, which is interposed between the third semiconductor layer and the first semiconductor layer, with a first gate insulating film interposed between the first gate electrode and the surface of the portion of the second semiconductor layer, and
a first main electrode that is electrically connected to the second semiconductor layer and the third semiconductor layer;
a sense insulated gate transistor including
a fourth semiconductor layer of the second conductivity type that is selectively provided in the surface layer of the first main surface of the first semiconductor layer so as to be separated from the second semiconductor layer,
a fifth semiconductor layer of the first conductivity type that is selectively provided in the fourth semiconductor layer,
a second gate electrode that is provided on a surface of a portion of the fourth semiconductor layer, which is interposed between the fifth semiconductor layer and the first semiconductor layer, with a second gate insulating film interposed between the second gate electrode and the surface of the portion of the fourth semiconductor layer, and
a second main electrode that is electrically connected to the first main electrode, the fourth semiconductor layer, and the fifth semiconductor layer;
a surge protective sense zener diode that is provided on the first main surface of the first semiconductor layer and is connected between the second gate electrode and the first main electrode; and
an asymmetric bidirectional diode that is provided on the first main surface of the first semiconductor layer, is connected between the first main electrode and the second main electrode, and sets a potential of the second main electrode to be higher than a potential of the first main electrode, wherein
a distance between the main insulated gate transistor and the sense insulated gate transistor is equal to or greater than 100 μm and equal to or less than 700 μm, and
each of the sense zener diode and the asymmetric bidirectional diode is arranged so as to face a portion of the sense insulated gate transistor that does not face the main insulated gate transistor.

2. The igniter according to claim 1,
wherein the distance is equal to or greater than 100 μm and equal to or less than 200 μm.

3. The igniter according to claim 1,
wherein the sense insulated gate transistor is surrounded in a rectangular shape by a carrier extraction layer that extracts a carrier which flows from the main insulated gate transistor to the sense insulated gate transistor.

4. The igniter according to claim 1,
wherein the main insulated gate transistor has a polygonal shape in a plan view which has an L-shaped portion formed by two adjacent sides or a concave portion formed by three adjacent sides that face the sense insulated gate transistor so as to surround a portion of the edge of the sense insulated gate transistor.

5. The igniter according to claim 1,
wherein the main insulated gate transistor and the sense insulated gate transistor are arranged such that the first main electrode and the second main electrode are connected through an electrode of the asymmetric bidirectional diode.

6. The igniter according to claim 1,
wherein a planar area of the sense zener diode is greater than a planar area of the asymmetric bidirectional diode.

7. The igniter according to claim 1,
wherein the igniter is a multi-chip igniter including a first semiconductor chip in which at least the main insulated gate transistor and the sense insulated gate transistor are formed and a second semiconductor chip in which a control circuit that controls the main insulated gate transistor and the sense insulated gate transistor is formed.

8. The igniter according to claim 1,
wherein the igniter is a one-chip igniter in which at least the main insulated gate transistor, the sense insulated gate transistor, and a control circuit that controls the main insulated gate transistor and the sense insulated gate transistor are formed in the same semiconductor chip.

9. The igniter according to claim 1,
wherein the main insulated gate transistor and the sense insulated gate transistor are insulated gate bipolar transistors including a sixth semiconductor layer of the second conductivity type that is provided on a second main surface of the first semiconductor layer and a third main electrode that is electrically connected to the sixth semiconductor layer.

10. The igniter according to claim 1,
wherein the main insulated gate transistor and the sense insulated gate transistor are insulated gate field effect transistors including a sixth semiconductor layer of the first conductivity type that is provided on a second main surface of the first semiconductor layer and a third main electrode that is electrically connected to the sixth semiconductor layer.

11. The igniter according to claim 1,
wherein the main insulated gate transistor has a planar gate structure or a trench gate structure in which the first gate electrode is provided in a trench that extends to the first semiconductor layer through the third semiconductor layer and the second semiconductor layer, with the first gate insulating film interposed therebetween.

12. The igniter according to claim 1,
wherein the sense insulated gate transistor has a planar gate structure or a trench gate structure in which the second gate electrode is provided in a trench that extends to the first semiconductor layer through the fifth semiconductor layer and the fourth semiconductor layer, with the second gate insulating film interposed therebetween.

13. The igniter according to claim 1, further comprising:
a control circuit that reduces a gate voltage of the main insulated gate transistor to limit overcurrent which flows to the main insulated gate transistor,
wherein a sense current which flows to the sense insulated gate transistor is in a saturation region at a time at which the control circuit reduces the gate voltage to the gate voltage value when a current of the main insulated gate transistor reaches a predetermined upper limit of the overcurrent.

14. The igniter according to claim 1, further comprising:
a control circuit that, before overcurrent flows to the main insulated gate transistor and a value of the overcurrent reaches a predetermined upper limit, calculates a current value of the main insulated gate transistor from a sense current value of the sense insulated gate transistor and reduces a gate voltage of the main insulated gate transistor such that the current of the main insulated gate transistor reaches a predetermined upper limit of the overcurrent.

15. The igniter according to claim 1, wherein
the sense insulated gate transistor is located outside of an outer periphery of the main insulated gate transistor,
the main insulated gate transistor has, in a plan view, a concave polygonal shape in which an interior angle, which defines a reentrant corner of the concave polygonal shape, is greater than 180 degrees, the sense insulated gate transistor is arranged so as to face two sides that form the interior angle of the main insulated gate transistor,
a distance between the sense insulated gate transistor and a first of the two sides is equal to or greater than 100 μm and equal to or less than 700 μm, and
a distance between the sense insulated gate transistor and a second of the two sides is equal to or greater than 100 μm and equal to or less than 700 μm.

* * * * *